US012676286B2

(12) United States Patent
    Son et al.

(10) Patent No.:     US 12,676,286 B2
(45) Date of Patent:         Jul. 7, 2026

(54) SUBSTRATE TREATING APPARATUS

(71) Applicant: SEMES CO., LTD., Cheonan-si (KR)

(72) Inventors: Duk Hyun Son, Cheonan-si (KR); Yu Ri Son, Busan (KR)

(73) Assignee: SEMES Co., Ltd., Cheonan-si (KR)

( * ) Notice:   Subject to any disclaimer, the term of this patent is extended or adjusted under 35 U.S.C. 154(b) by 428 days.

(21) Appl. No.: 17/489,989

(22) Filed:     Sep. 30, 2021

(65)                Prior Publication Data

US 2022/0108868 A1      Apr. 7, 2022

(30)       Foreign Application Priority Data

Oct. 7, 2020     (KR) ......................... 10-2020-0129617

(51) Int. Cl.
     *H01J 37/244*     (2006.01)
     *G01N 15/06*      (2024.01)
     *H01J 37/32*      (2006.01)
(52) U.S. Cl.
     CPC ............ *H01J 37/244* (2013.01); *G01N 15/06* (2013.01); *H01J 37/32449* (2013.01); *H01J 37/32816* (2013.01); *H01J 37/32899* (2013.01); *H01J 2237/24585* (2013.01)
(58) Field of Classification Search
     CPC ................. H01J 37/244; H01J 37/3244; H01J 37/32449; H01J 37/32733; H01J 37/32743; H01J 37/32816; H01J 37/32825; H01J 37/32834; H01J 37/32899; H01J 2237/24585; H01L 21/67155; H01L 21/67196; H01L 21/67201; H01L 21/677; H01L 21/67739; H01L 21/67778; C23C 16/45561; G01N 15/06

See application file for complete search history.

(56)             References Cited

U.S. PATENT DOCUMENTS 4,928,537  A  *   5/1990   Liu ....................... G01N 1/2202
                                                73/864.33
4,949,671  A  *   8/1990   Davis .................. H01J 37/3244
                                                118/725

(Continued)

FOREIGN PATENT DOCUMENTS

CN            113169102  B      4/2025
JP          2010-056270  A      3/2010

(Continued)

OTHER PUBLICATIONS

Office Action for Korean Application No. 10-2020-0129617 dated Apr. 6, 2023.

(Continued)

*Primary Examiner* — Gordon Baldwin
*Assistant Examiner* — Joshua Reyes
(74) *Attorney, Agent, or Firm* — Harness, Dickey & Pierce, P.L.C.

(57)                ABSTRACT

Disclosed is a substrate treating apparatus. The substrate treating apparatus includes a load lock chamber, of which a pressure of an interior space is changed between a first pressure and a second pressure that is lower than the first pressure, an index chamber connected to the load lock chamber, and a measurement unit that measures a level of particles in the interior space, and the measurement unit is located outside the load lock chamber.

13 Claims, 16 Drawing Sheets

(56) References Cited

U.S. PATENT DOCUMENTS

| | | | | |
|---|---|---|---|---|
| 5,145,493 | A * | 9/1992 | Nguyen | G01N 21/01 |
| | | | | 95/31 |
| 5,314,541 | A * | 5/1994 | Saito | H01L 21/67201 |
| | | | | 118/724 |
| 6,074,202 | A * | 6/2000 | Yagi | H01L 21/67201 |
| | | | | 432/152 |
| 6,244,120 | B1 * | 6/2001 | Maeda | G01N 15/06 |
| | | | | 73/864.81 |
| 6,475,367 | B1 * | 11/2002 | Toyama | C25D 7/0614 |
| | | | | 205/333 |
| 11,036,202 | B2 | 6/2021 | Sadeghi et al. | |
| 2003/0041969 | A1 * | 3/2003 | Schneider | G01N 15/06 |
| | | | | 156/345.24 |
| 2008/0110233 | A1 * | 5/2008 | Tanaka | H01L 22/26 |
| | | | | 73/23.21 |
| 2015/0211977 | A1 * | 7/2015 | Sekimoto | G01N 15/1459 |
| | | | | 356/338 |
| 2018/0247836 | A1 * | 8/2018 | Lee | B08B 7/0071 |
| 2020/0192325 | A1 * | 6/2020 | Sadeghi | G05B 19/4065 |

FOREIGN PATENT DOCUMENTS

| | | | |
|---|---|---|---|
| JP | 2017-053822 | A | 3/2017 |
| KR | 20-0122311 | | 5/1998 |
| KR | 10-0167283 | | 9/1998 |
| KR | 10-2007-0121614 | A | 12/2007 |
| KR | 10-2019-0019639 | A | 2/2019 |
| KR | 10-2019-0050254 | A | 5/2019 |
| KR | 10-2706037 | B1 | 9/2024 |
| TW | I850298 | B | 8/2024 |
| WO | 2020-123570 | A1 | 6/2020 |

OTHER PUBLICATIONS

Korean Office Action dated Oct. 28, 2022 for corresponding Korean Application No. 10- 2020-0129617.
Oiffice Action issued Mar. 28, 2025 in China Application No. 202111172031.1.

* cited by examiner

SUBSTRATE TREATING APPARATUS

CROSS-REFERENCE TO RELATED APPLICATIONS

A claim for priority under 35 U.S.C. § 119 is made to Korean Patent Application No. 10-2020-0129617 filed on Oct. 7, 2020, in the Korean Intellectual Property Office, the entire contents of which are hereby incorporated by reference.

BACKGROUND

Embodiments of the inventive concept described herein relate to a substrate treating apparatus.

Plasma refers to an ionized gaseous state including ions, radicals, and electrons. The plasma is generated by very high temperature, strong electric fields, or radio frequency (RF) electromagnetic fields. A semiconductor device manufacturing process may include an etching process of removing a thin film formed on a substrate, such as a wafer, by using plasma. The etching process is performed as ions and/or radicals contained in plasma collide a thin film on a substrate or react with a thin film.

In general, an apparatus for treating a substrate, such as a wafer, by using plasma includes a process chamber that treats the substrate by using the plasma, and a transfer chamber that transfers the substrate into the process chamber. Furthermore, to increase a substrate treatment efficiency by using the plasma, the process chamber is maintained substantially in a vacuum pressure atmosphere, and thus the transfer chamber is maintained in a vacuum pressure atmosphere. To carry the substrate into the transfer chamber that is maintained in the vacuum pressure atmosphere, a general substrate treating apparatus includes a load lock chamber, by which an internal atmosphere provided at a front end of the transfer chamber is switched between the vacuum pressure atmosphere and the atmospheric pressure atmosphere. The substrate is carried into the load lock chamber switched to the atmospheric pressure atmosphere, and thereafter, the atmosphere in the load lock chamber is switched to the vacuum pressure atmosphere, and then, the substrate is carried out of the load lock chamber and is carried into the transfer chamber. The substrate carried into the transfer chamber is delivered to the process chamber. The retrieval of the treated substrate is performed in a reverse sequence.

Treated substrates as well as untreated substrates are repeatedly carried into the lock chamber. Impurities, such as fumes, which may be generated in a process of treating a substrate, may be attached to the treated substrate, and accordingly, there is a high possibility of, contamination by fumes, being generated in the load lock chamber. Accordingly, it is necessary to periodically monitor a level of particles that causes fumes and the like, which reside in the load lock chamber. To achieve this, measures of installing a sensor that measures the level of the particles in an interior space of the load lock chamber may be considered. However, according to the measure, there is a possibility of a sensor occupying a larger portion of an interior space of the load lock chamber according to a size of the sensor, and there also is a possibility of causing an error in measuring the level of the particles according to an installation location of the sensor. Furthermore, a very narrow aperture may be formed in an interior space of the load lock chamber due to installation of the sensor, and thus there is a possibility of impurities, such as particles, residing in the corresponding aperture.

SUMMARY

Embodiments of the inventive concept provide a substrate treating apparatus that may measure a level of particles in a chamber, of which a pressure of an interior space is changed.

Embodiments of the inventive concept also provide a substrate treating apparatus that may periodically measure a level of particles in a load lock chamber.

Embodiments of the inventive concept also provide a substrate treating apparatus that may further increase a measurement precision of a level of particles that reside in a chamber.

The aspect of the inventive concept is not limited thereto, and other unmentioned aspects of the present invention may be clearly appreciated by those skilled in the art from the following descriptions.

The inventive concept provides a substrate treating apparatus. The substrate treating apparatus includes a load lock chamber, of which a pressure of an interior space is changed between a first pressure and a second pressure that is lower than the first pressure, an index chamber connected to the load lock chamber, and a measurement unit that measures a level of particles in the interior space, and the measurement unit is located outside the load lock chamber.

According to an embodiment, the measurement unit may include a measurement passage provided between the load lock chamber and the index chamber, and a measurement sensor installed on the measurement passage, and that measure the level of the particles in the interior space.

According to an embodiment, the measurement unit may further include a measurement container installed on the measurement passage, and having a sensing space, and the measurement sensor may measure the level of the particles in the sensing space.

According to an embodiment, a gas supply line that supplies gas into the interior space and a pressure reducing line that reduces a pressure of the interior space may be connected to the load lock chamber.

According to an embodiment, the substrate treating apparatus may further include a controller, and the controller may control the gas supply line and the measurement unit to increase the pressure of the interior space by, by the gas supply line, supplying the gas into the interior space when the level of the particles of the interior space is to be measured.

According to an embodiment, a measurement sensor included in the measurement unit and that measure the level of the particles may be provided on the pressure reducing line.

The inventive concept provides a substrate treating apparatus. The substrate treating apparatus includes a load lock chamber having a first interior space, of which a pressure is changed between a first pressure and a second pressure that is lower than the first pressure, a second chamber connected to the first chamber and having a second interior space, of which a pressure is maintained at a third pressure, and a measurement unit that measures a level of particles in the first interior space, and the measurement unit further includes a measurement passage provided between the first chamber and the second chamber, and a measurement sensor that measures a level of particles of a fluid flowing in the interior space.

According to an embodiment, the measurement unit may further include a measurement container installed on the measurement passage, and having a sensing space, and the measurement sensor may measure the level of the particles in the sensing space.

According to an embodiment, a gas supply line that supplies an inert gas into the first interior space and a pressure reducing line that reduces a pressure of the first interior space may be connected to the first chamber.

According to an embodiment, the substrate treating apparatus may further include a controller, and the controller may control the gas supply line and the measurement unit to increase the pressure of the first interior space by, by the gas supply line, supplying the inert gas into the first interior space when the level of the particles of the first interior space is to be measured.

According to an embodiment, the substrate treating apparatus may further include a controller, and the controller may control any one of the gas supply line, the pressure reducing line, and the measurement unit such that gas currents in the first interior space flows in the measurement passage by a difference between the pressures of the first interior space and the second interior space when the level of the particles in the first interior space is to be measured.

According to an embodiment, the measurement unit may further include a valve installed in the measurement passage, and the substrate treating apparatus may further include a controller that controls the measurement unit.

According to an embodiment, the controller may control at least any one of the gas supply line, the pressure reducing line, and the measurement unit to switch on the valve after a pressure difference is generated between the first interior space and the second interior space.

According to an embodiment, the valves may include a first valve that receives a control signal from the controller and that is switched on and off, and a second valve that is switched on and off through a manual manipulation.

According to an embodiment, a gate valve that selectively communicates the first interior space and the second interior space may be provided between the first chamber and the second chamber, and the controller may control at least any one of the gas supply line, the pressure reducing line, and the measurement unit to switch on the first valve after a pressure of the first interior space is raised from the second pressure to the first pressure.

According to an embodiment, the first pressure may be the same as the third pressure.

The inventive concept provides a substrate treating apparatus. The substrate treating apparatus includes an index chamber, in which a load pot in which a container is seated, is installed, and of which an internal atmosphere is maintained at an atmospheric pressure atmosphere, a process chamber that treats a substrate, a transfer chamber that transfers the substrate to the process chamber, and of which an internal atmosphere is maintained at a vacuum pressure atmosphere, a load lock chamber provided between the transfer chamber and the index chamber, and of which an internal atmosphere is changed between the atmospheric pressure atmosphere and the vacuum pressure atmosphere, and a measurement unit that measures a level of particles in the load lock chamber, and the measurement unit includes a measurement passage, one end of which is connected to the load lock chamber, and an opposite end of which is connected to the index chamber, and a measurement sensor that measures a level of particles of a fluid flowing in the measurement passage.

According to an embodiment, the measurement unit may include a measurement container installed on the measurement passage, and having a sensing space, and a valve installed on the measurement passage, and the measurement sensor may measure the level of the particles in the sensing space.

According to an embodiment, a gas supply line that supplies gas into the load lock chamber and a pressure reducing line that reduces a pressure of the load lock chamber may be connected to the load lock chamber.

According to an embodiment, the substrate treating apparatus may further include a controller, the controller may control the gas supply line such that a pressure in the load lock chamber becomes a pressure in the index chamber by, by the gas supply line, supplying the gas into a space in the load lock chamber when the level of the particles in the load lock chamber is to be measured, and the valve may be switched on after the pressure in the load lock chamber becomes higher than the present in the index chamber.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 12 is a view illustrating a state of the substrate treating apparatus that increases a pressure in the load lock chamber;

FIG. 15 is a view illustrating a state, in which measurement of a level of particles in the load lock chamber is ended by switching off the valve;

FIG. 18 is a view illustrating a substrate treating apparatus according to another embodiment of the inventive concept;

FIG. 20 is a view illustrating a substrate treating apparatus according to another embodiment of the inventive concept.

DETAILED DESCRIPTION

Figure 1:
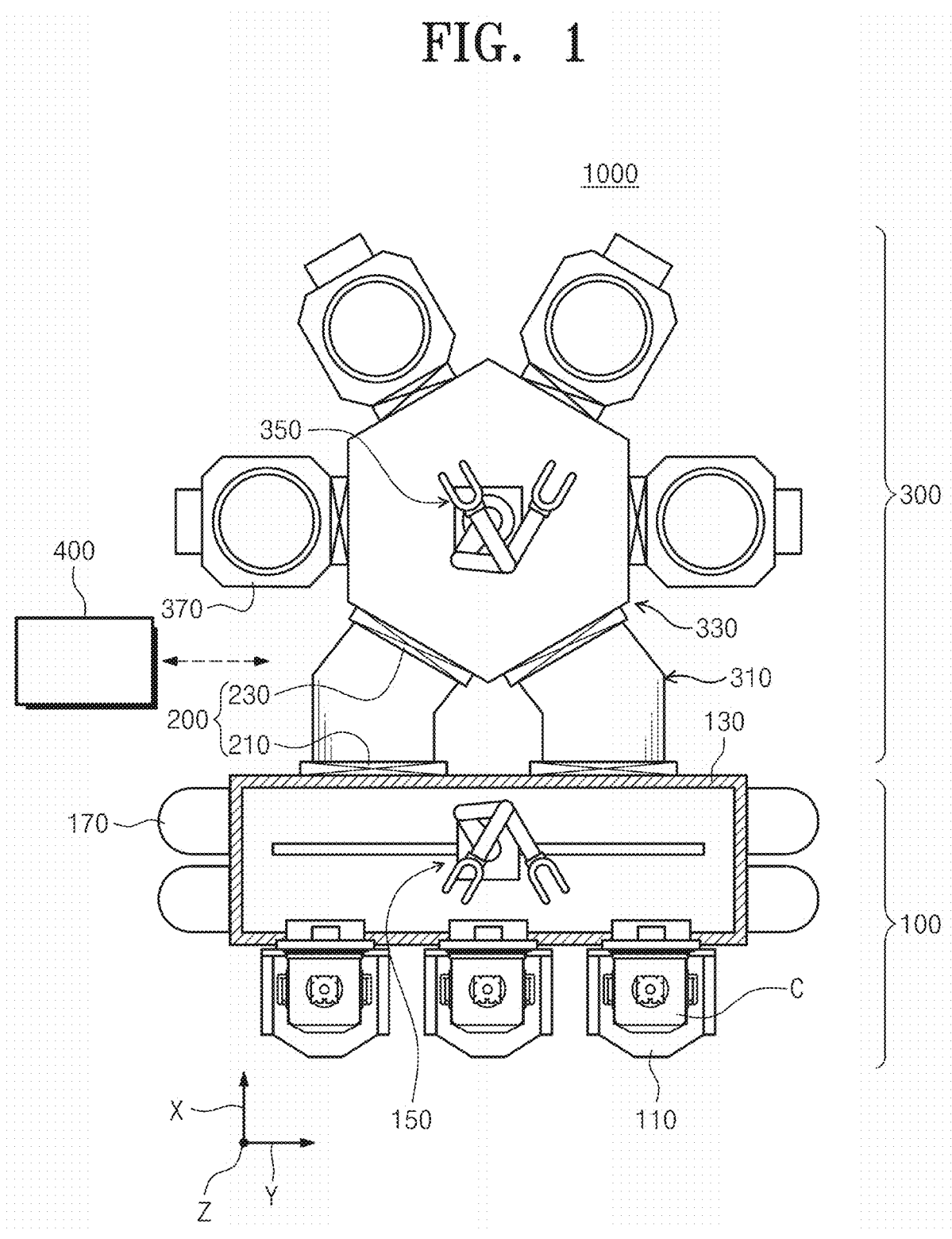
FIG. 1 is a plan view schematically illustrating a substrate treating apparatus according to an embodiment of the inventive concept.

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. However, the inventive concept may be implemented in various different forms, and is not limited to the embodiments. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms of a singular form may include plural forms unless otherwise specified. Furthermore, in the drawings, the shapes and sizes of the elements may be exaggerated for clearer description.

The terms such as first and second may be used to describe various elements, but the elements are not limited to the terms. The terms may be used only for the purpose of distinguishing one element from another element. For example, while not deviating from the scope of the inventive concept, a first element may be named a second element, and similarly, the second element may be named the first element.

When it is mentioned that one element is "connected to" or "electrically connected to" another element, it should be understood that the first element may be directly connected or electrically connected to the second element but a third element may be provided therebetweeen. On the other hand, when it is mentioned that an element is "directly connected to" or "directly electrically connected to" another element, it should be understood that a third element is not present between them. It should be construed that other expressions that describe the relationships between elements, such as "between", "directly between", "adjacent to", and "directly adjacent to" may have the same purpose.

In addition, unless defined otherwise, all terms used herein, including technical or scientific terms, have the same meanings as those generally understood by those skilled in the art to which the inventive concept pertains. The terms defined in the generally used dictionaries should be construed as having the meanings that coincide with the meanings of the contexts of the related technologies, and should not be construed as ideal or excessively formal meanings unless clearly defined in the specification of the present disclosure.

Hereinafter, embodiments of the inventive concept will be described with reference to FIGS. 1 to 17.

FIG. 1 is a plan view schematically illustrating a substrate treating apparatus according to an embodiment of the inventive concept. Referring to FIG. 1, a substrate treating apparatus 1000 according to an embodiment of the inventive concept may include an index unit 100, a process executing unit, and a controller 400. The index unit 100 and the process executing unit may be arranged along a first direction "X" when viewed from a top. Hereinafter, a direction that is perpendicular to the first direction "X" when viewed from the top is defined as a second direction "Y". Furthermore, a direction that is perpendicular to the first direction "X" and the second direction "Y" is defined as a third direction "Z". Here, the third direction "Z" may refer to a direction that is perpendicular to a ground surface.

The index unit 100 may include a load pot 110, an index chamber 130, a first transfer robot 150, and a side buffer 170.

A container "C" may be seated in the load pot 110. A portion of the container "C" seated in the load pot 110 may receive a substrate "W" (for example, a wafer) that is transferred to the process executing unit 300. Furthermore, another portion of the container "C" seated in the load pot 110 may receive a ring member FR and/or a wafer type sensor that is transferred to the process executing unit 300. The wafer type sensor may be a base that may monitor a substrate treating process performed in the process chamber 370, which will be described below. Furthermore, another portion of the container "C" seated in the load pot 110 may receive a carrier that transfers the ring member FR. The container "C" may be transferred to the load pot 110 by a container transfer apparatus to be loaded in the load pot 110 or unloaded from the load pot 110, and may be transferred. The container transfer apparatus may be an overhead transport apparatus (hereinafter, an OHT), but the inventive concept is not limited thereto and the container "C" may be transferred by various apparatuses that transfer the containers "C". Furthermore, an operator may directly load the container "C" in the load pot 110 or unload the container "C" seated in the load pot 110 from the load pot 110.

An index chamber 130 may be provided between the load pot 110 and the process executing unit 300. The index chamber 130 may be maintained in an atmospheric atmosphere. The side buffer 170 that is a keeping site may be installed on one side of the index chamber 130. Furthermore, an alignment unit that aligns the substrate "W", the ring member FR, and/or the water type sensor may be provided at a portion of the side buffer 170.

Furthermore, the first transfer robot 150 may be provided in the index chamber 130. The first transfer robot 150 may transfer the substrate "W", the ring member FR, and/or the water type sensor seated in the load pot 110, a load lock chamber 310, which will be described below, and the side buffer 170.

The process executing unit 300 may include a load lock chamber 310, a transfer chamber 330, a second transfer robot 350, and a process chamber 370.

The load lock chamber 310 may be disposed between the transfer chamber 330 and the index chamber 130. The load lock chamber 310 may be disposed between the transfer chamber 330 and the index chamber 130. An internal atmosphere of the load lock chamber 310 may be converted between an atmospheric atmosphere and a vacuum pressure atmosphere. As described above, because the internal atmosphere of the transfer chamber 330 is maintained in the vacuum pressure atmosphere, the atmosphere of the load lock chamber 310 may be converted between the atmospheric atmosphere and the vacuum atmosphere to transfer the substrate "W", the ring member FR, and/or the water type sensor between the transfer chamber 330 and the index chamber 130.

A gate valve 200 may be installed between the load lock chamber 310 and the index chamber 130, or between the load lock chamber 310 and the transfer chamber 330, which will be described below. For example, a first gate valve 210 may be provided between the load lock chamber 310 and the index chamber 130. The first gate valve 210 may selectively communicate a space in the load lock chamber 310 and a space in the index chamber 130. Furthermore, a second gate valve 230 may be provided between the load lock chamber 310 and the transfer chamber 330. The second gate valve 210 may selectively communicate a space in the load lock chamber 310 and a space in the transfer chamber 330.

The transfer chamber 330 may be disposed between the load lock chamber 310 and the process chamber 370. The internal atmosphere of the transfer chamber 330 may be maintained in the vacuum pressure atmosphere. Furthermore, the second transfer robot 350 may be provided in the transfer chamber 330. The second transfer robot 350 may transfer at least one of the substrate "W", the ring member FR, and the wafer type sensor between the load lock chamber 310 and the process chamber 370.

At least one process chamber 370 may be connected to the transfer chamber 330. The process chamber 370 may be a chamber that performs a process on the substrate "W". The process chamber 370 may be a liquid treating chamber that treats the substrate "W" by supplying a treatment liquid to the substrate "W". Furthermore, the process chamber 370 may be a plasma chamber that treats the substrate "W" by using plasma. Furthermore, some of the process chambers 370 may be liquid treatment chambers that treat the substrate "W" by supplying a treatment liquid to the substrate "W", and some of the process chambers 370 may be plasma chambers that treat the substrate "W" by using plasma. However, the inventive concept is not limited thereto, and a substrate treating process performed in the process chamber 370 may be variously modified to known substrate treating processes. Furthermore, when the process chamber 370 is a plasma chamber that treats the substrate "W" by using the plasma, the plasma chamber may be a chamber that performs an etching or ashing process of removing a thin film on the substrate "W" by using the plasma. However, the inventive concept is not limited thereto, and a plasma treatment process performed in the process chamber 370 may be variously modified to known plasma treatment processes.

Furthermore, FIG. 1 illustrates as an example that the transfer chamber 330 has a substantially hexagonal shape when viewed from the top, and four process chambers 370 connected to the transfer chamber 330 are provided, but the inventive concept is not limited thereto. For example, the shape of the transfer chamber 330 and the number of the process chambers 370 may be variously modified according to the necessity of the user, and the number of substrates "W" that requires a treatment.

The controller 400 may control the substrate treating apparatus 1000. The controller 400 may control the substrate treating apparatus 1000 such that the substrate treating apparatus 100 performs a treatment process on the substrate "W". For example, the controller may control the substrate treating apparatus 1000 to carry out the substrate "W" from the container "C", in which the substrate "W" to be treated is received, and to transfer to the carried substrate "W" to the process chamber 370.

Furthermore, when a specific number of substrate "W" is treated in the process chamber 370 or the shape of the ring member FR provided in the process chamber 370 is deformed by a degree that deviates an allowable range, the controller 400 may perform the substrate treating apparatus 1000 to replace the ring member FR provided in the process chamber 370. For example, the controller 400 may control the second transfer robot 350 to carry out the used ring member FR from the process chamber 370. For example, the controller 400 may control the second transfer robot 350 to transfer the used ring member FR carried out from the process chamber 370 to the load lock chamber 310. Furthermore, the controller 400 may control the first transfer robot 150 to carry out the used ring member FR carried to the load lock chamber 310.

Furthermore, the controller 400 may control the first transfer robot 150 to transfer the used ring member FR carried out from the load lock chamber 310 into the container "C". Furthermore, the controller 400 may control the first transfer robot 150 to carry out an unused ring member FR from the container "C". Furthermore, the controller 400 may control the first transfer robot 150 to transfer an unused ring member FR to the load lock chamber 310. Furthermore, the controller 400 may control the second transfer robot 350 to transfer the unused ring member FR from the load lock chamber 310 to the process chamber 370.

Furthermore, the controller 400 may include a process controller including a microprocessor (computer) that executes control of the substrate treating apparatus 100, a keyboard for inputting commands to allow an operator to manage the substrate treating apparatus 1000, a user interface including a display that visualizes and displays an operation situation of the substrate treating apparatus 1000, and a memory unit for storing a control program for executing processing executed by the substrate treating apparatus 1000 under a control of the process controller, or a program for executing processing, that is, a processing recipe in elements according to various data and processing conditions. Furthermore, the user interface and the memory unit may be connected to the process controller. The processing recipe may be stored in a memory medium of the memory unit, and the memory medium may be a hard disk, and may be a transportable disk such as a CD-ROM, a DVD, or the like, a semiconductor memory such as a flash memory.

Hereinafter, the load lock chamber 310 according to the embodiment of the inventive concept will be described in detail.

Figure 2:
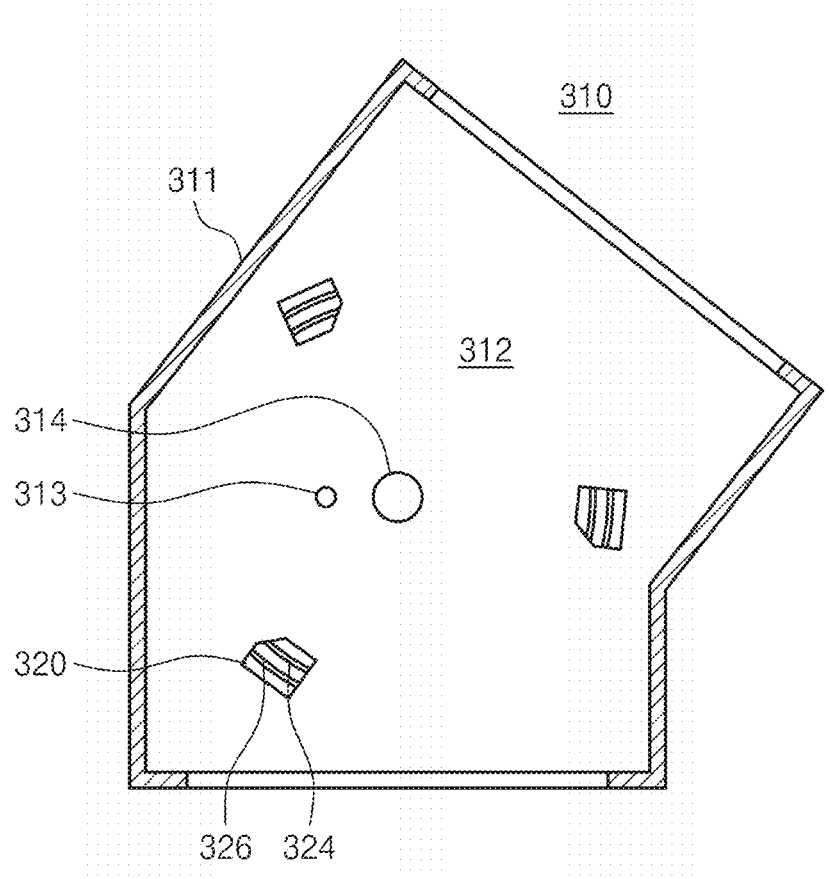
FIG. 2 is a view illustrating the substrate treating apparatus provided in a load lock chamber of FIG. 1.

FIG. 2 is a view illustrating the substrate treating apparatus provided in a load lock chamber of FIG. 1. In detail, FIG. 2 is a plan view illustrating the load lock chamber of FIG. 1. Referring to FIG. 2, the load lock chamber 310 according to the embodiment of the inventive concept may include a housing 311 and a support shelf 320.

The housing 311 may have a first interior space 312. The housing 311 may have the first interior space 312, in which the substrate "W" or the ring member FR is seated. The housing 311 may be disposed between the index chamber 130 and the transfer chamber 130, which have been described above. Furthermore, the housing 311 may have an opening. A plurality of openings may be provided in the housing 311. For example, any one of the openings may be selectively communicated with the index chamber 130 by a gate valve (not illustrated). Furthermore, another one of the openings may be selectively communicated with the transfer chamber 330 by a gate valve (not illustrated).

Furthermore, the housing 311 may have a vent hole 313, through which vent gas is supplied into the first interior space 312. The vent gas may be an inert gas. For example, the vent gas may be a gas including nitrogen, argon, and the like. However, the inventive concept is not limited thereto, and the vent gas may be various known inert gases. The vent hole 313 may be connected to a gas supply line 610 of a pressure adjusting unit 600.

Furthermore, the housing 311 may have a pressure reducing hole 313 that reduces a pressure in the interior space 312 of the housing 311. For example, the pressure reducing hole 314 may exhaust gas currents in the first interior space 312 of the housing 311 to the outside. The pressure reducing hole 314 may be connected to a pressure reducing line 630 of the pressure adjusting unit 600, which will be described below.

The support shelf 320 may be provided in the first interior space 312. The support shelf 320 may support the substrate "W" or the ring member FR in the first interior space 312. For example, the substrate "W" may be a wafer having a disk shape. Furthermore, the ring member FR may be a process kit provided in the process chamber 370. For example, the ring member FR may be an ISO ring or a focusing ring. Furthermore, a diameter of the ring member FR may be larger than that of the substrate "W".

At least one support shelf 320 may be provided. For example, a plurality of support shelves 320 may be provided. The support shelves 320 may be provided to be spaced apart from each other when viewed from a top. The support shelves 320 may be provided to be spaced apart from each other along a circumferential direction of an imaginary circle, when viewed from a top. For example, three support shelves 320 may be provided. The three support shelves 320 may be provided to be spaced apart from each other along a circumferential direction of an imaginary circle, when viewed from a top.

Figure 3:
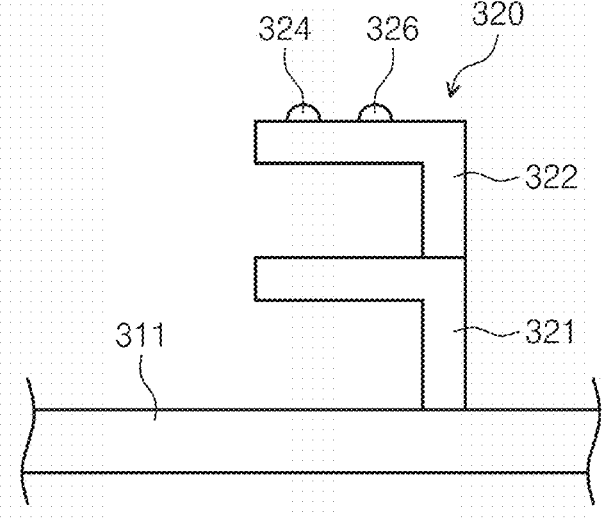
FIG. 3 is a cross-sectional view illustrating a support shelf of FIG. 2.

FIG. 3 is a cross-sectional view illustrating a support shelf of FIG. 2. The support shelf 320 illustrated in FIG. 3 is any one of the support shelves 320 of FIG. 2, and the structures of the other support shelves 320 are the same as or similar to the structure of the support shelf 320 illustrated in FIG. 3. Referring to FIG. 3, the support shelf 320 may include a first shelf 321 and a second shelf 322. The first shelf 321 and the second shelf 322 may have different heights. For example, the second shelf 322 may be disposed above the first shelf 321. That is, the height of the second shelf 322 may be larger than the height of the first shelf 321. The first shelf 321 and the second shelf 322 may have a substantially inverse "L" shape when cross-sections thereof are viewed.

Furthermore, the support shelf 320 may include a first pad 324 and a second pad 326. The first pad 324 and the second pad 326 may be installed on an upper surface of at least one of the first shelf 321 and the second shelf 322. For example, the first pad 324 and the second pad 326 may be installed on an upper surface of the second shelf 322.

The first pad 324 and the second pad 326 may be formed of a material that has an anti-friction property against the substrate "W" or the ring member FR. For example, the first pad 324 and the second pad 326 may be formed of polyetheretherketone (PEEK) filled with carbon. However, the embodiment, in which the PEEK filled with carbon is used as the material of the first pad 324 and the second pad 326, is merely an example, and various modifications may be made with other known materials having similar properties.

Figure 4:
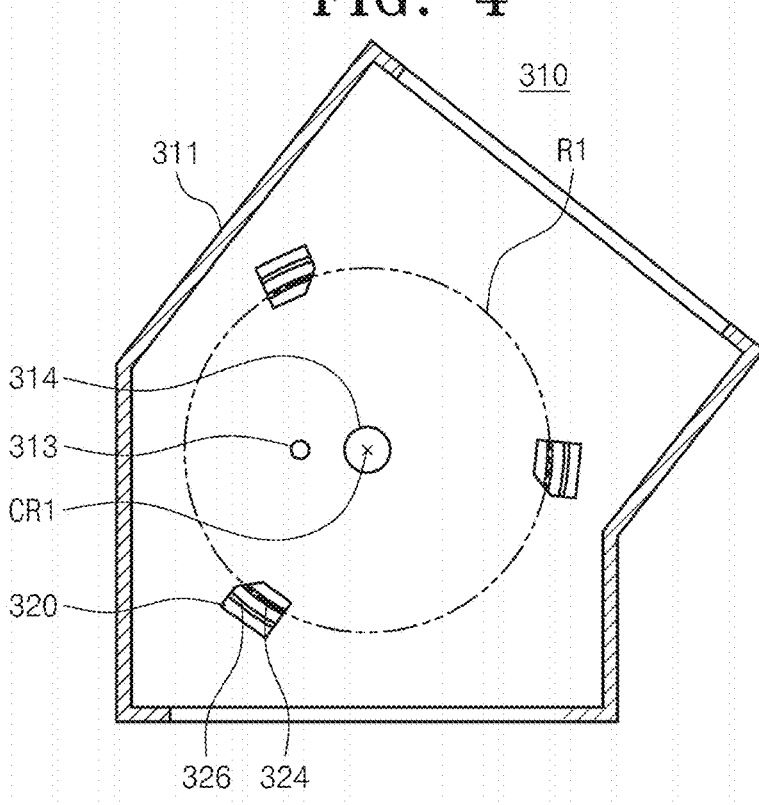
FIG. 4 is a view illustrating disposition of the support shelves of FIG. 2, and first pads provided in the support shelves.

FIG. 4 is a view illustrating disposition of the support shelves of FIG. 2, and first pads provided in the support shelves. Referring to FIG. 4, the first pad 324 may have a substantially arc shape when viewed from a top. Furthermore, the first pads 324 installed in the support shelves 320 may be installed to overlap an imaginary first circle R1 when viewed from the top. That is, the center points of the first pads 324 having an arc shape and the center point of the imaginary first circle R1 may be the same first center CR1.

Figure 5:
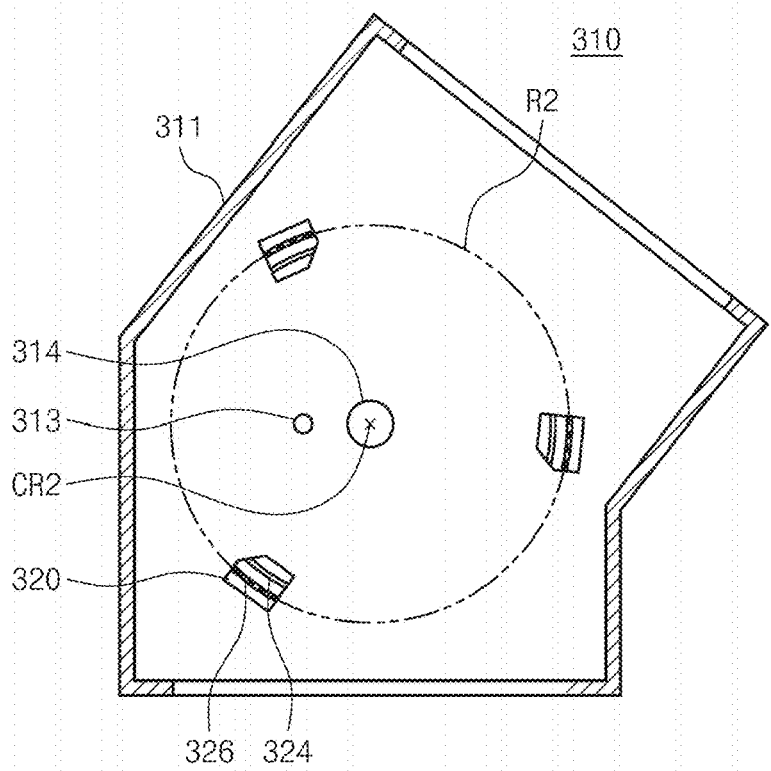
FIG. 5 is a view illustrating disposition of the support shelves of FIG. 2, and second pads provided in the support shelves.

FIG. 5 is a view illustrating disposition of the support shelves of FIG. 2, and second pads provided in the support shelves. Referring to FIG. 5, the second pad 326 may have a substantially arc shape when viewed from a top. Furthermore, the second pads 326 installed in the support shelves 320 may be installed to overlap an imaginary second circle R2 when viewed from the top. That is, the center points of the second pads 326 having an arc shape and the center point of the imaginary second circle R2 may be the same second center CR2. Furthermore, the second center CR2 may coincide with the above-described first center CR1. Furthermore, a diameter of the second circle R2 may be larger than a diameter of the first circle R1.

Figure 6:
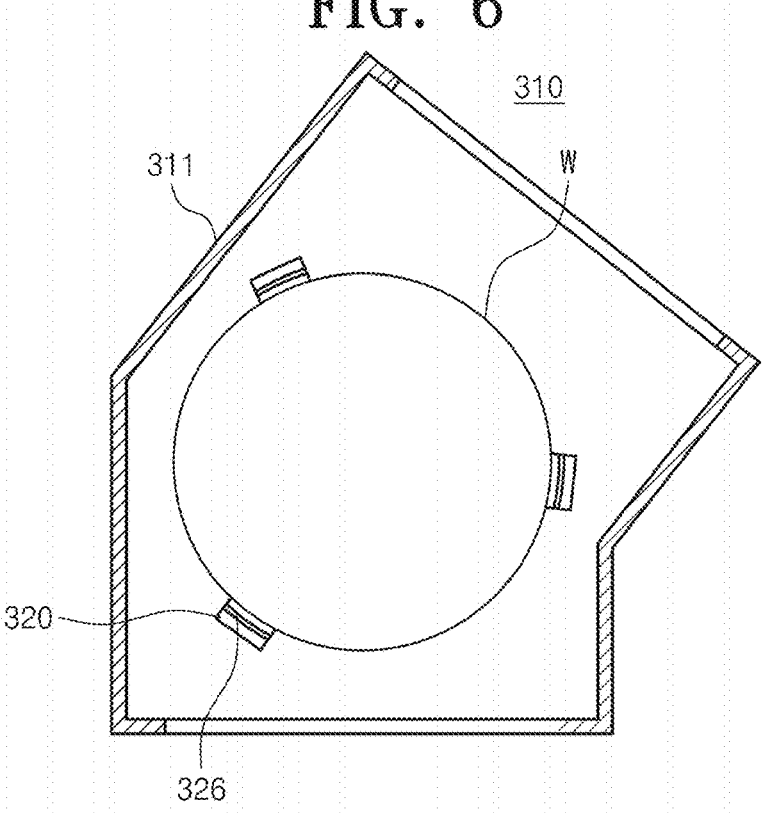
FIG. 6 is a view illustrating a state, in which a substrate is seated in the load lock chamber of FIG. 2.
Figure 7:
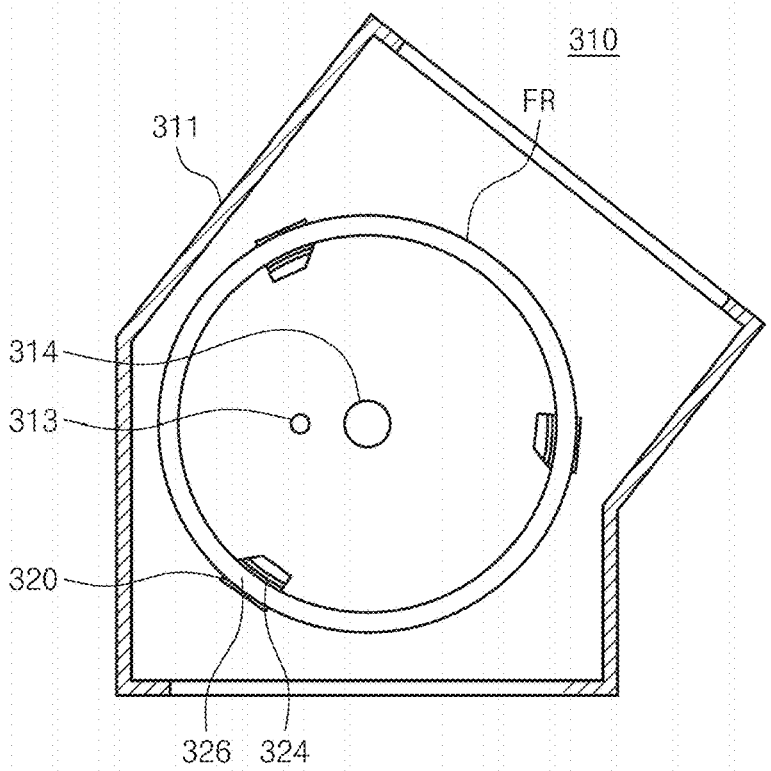
FIG. 7 is a view illustrating a state, in which a ring member is seated in the load lock chamber of FIG. 2.

FIG. 6 is a view illustrating a state, in which a substrate is seated in the load lock chamber of FIG. 2. FIG. 7 is a view illustrating a state, in which a ring member is seated in the load lock chamber of FIG. 2. Referring to FIGS. 6 and 7, in the load lock chamber 310 according to the embodiment of the inventive concept, the substrate "W" or the ring member FR may be supported in one first interior space 312 as each of the support selves 320 has the first pad 324 and the second pad 326. Furthermore, because the first pads 324 are installed to overlap the imaginary first circle R1 and the second pads 326 are installed to overlap the imaginary second circle R2 and the first center CR1 of the first circle R1 and the second center CR2 of the second circle R2 coincide with each other, the centers of the ring member FR and the substrate "W" supported by the load lock chamber 310 may coincide with each other when viewed from the top. Accordingly, a robot calibration technology for the first transfer robot 150 and the second transfer robot 350 may be applied to the substrate "W" and the ring member FR in the same way. Accordingly, the number of calibrations performed on the first transfer robot 150 and the second transfer robot 350 may be decreased to a half, and thus a period of time for performing the calibrations may be minimized. Furthermore, a precision of the calibrations for the substrate "W" and the ring member FR may be further increased. Because the calibrations for the substrate "W" and the ring member FR are common, the calibrations may be performed more intensely.

Furthermore, as described above, a shape of the first pad 324 and/or the second pad may have a substantially arc shape. This increases a contact area for the substrate "W" or the ring member FR as compared with a case, in which the first pad 324 and/or the second pad 326 simply has a linear shape, and thus sliding of the substrate "W" or the ring member FR may be minimized.

Figure 8:
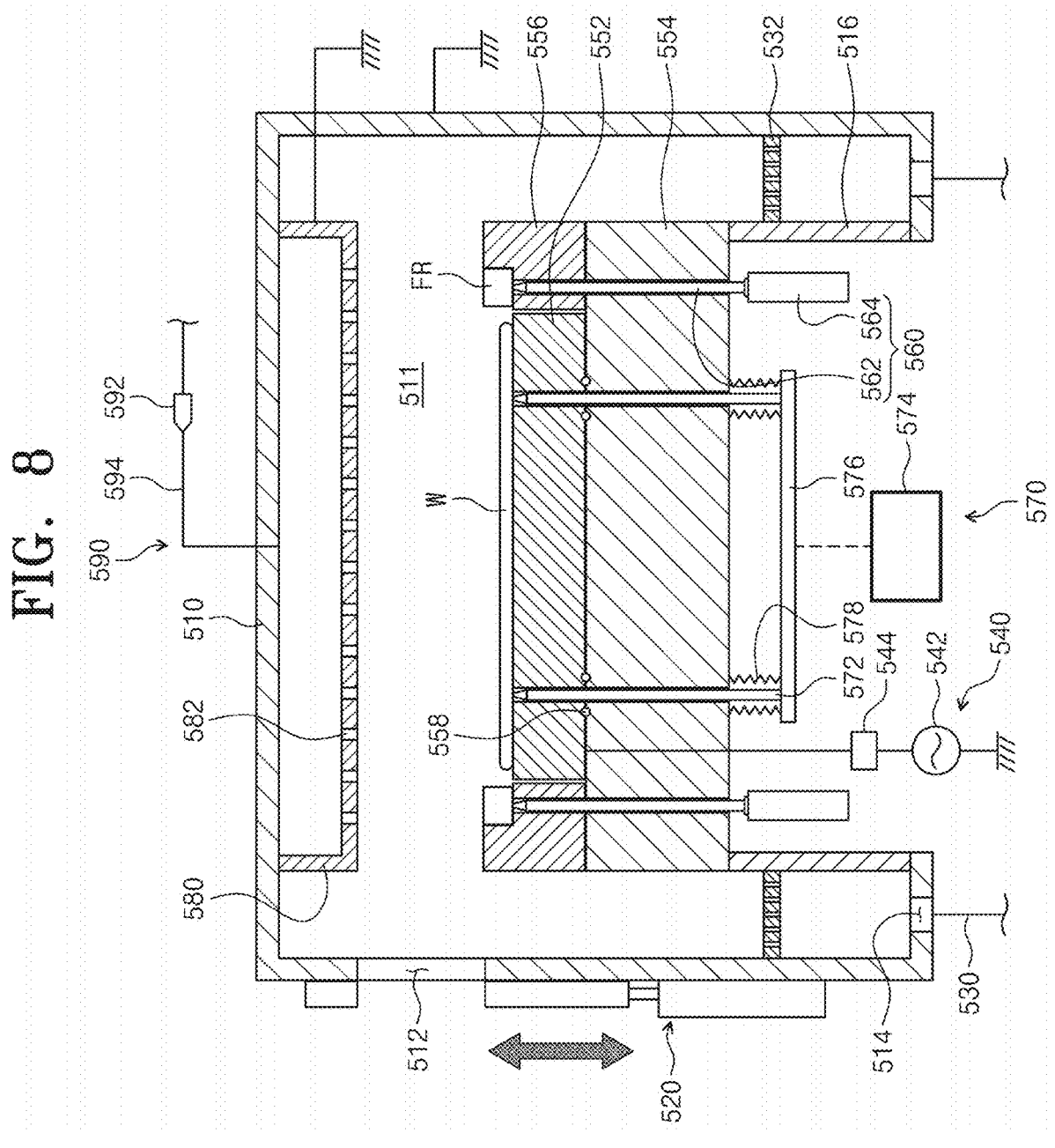
FIG. 8 is a view illustrating the substrate treating apparatus provided in the process chamber of FIG. 1.

FIG. 8 is a view illustrating the substrate treating apparatus provided in the process chamber of FIG. 1. Referring to FIG. 8, the substrate treating apparatus 500 provided in the process chamber 370 will be described in detail. The substrate treating apparatus 500 may treat the substrate "W" by transferring plasma to the substrate "W".

The substrate treating apparatus 500 may include a process chamber 510, a gate valve 520, an exhaust line 530, a power source unit 540, a support unit 550, a ring lift module 560, a substrate lift module 570, a baffle plate 580, and a gas supply unit 590.

The process chamber 510 may have a treatment space 511. The process chamber 510 may be grounded. The process chamber 510 may provide the treatment space 511, in which the substrate "W" is treated. The treatment space 511 of the process chamber 510 may be maintained substantially at a vacuum atmosphere when the substrate "W" is treated. An entrance 512, through which the substrate "W" or the ring member FR is carried in and out, may be formed on one side of the process chamber 510. The gate valve 520 may selectively open and close the entrance 512.

An exhaust hole 514 may be formed on a bottom surface of the process chamber 510. The exhaust line 514 may be connected to the exhaust hole 124. The exhaust line 530 may exhaust a process gas, a process by-product, and the like supplied to the treatment space 511 of the process chamber 510 to an outside of the process chamber 510 through the exhaust hole 514. Furthermore, an exhaust plate 532 that makes it possible to exhaust the treatment space more uniformly may be provided at an upper portion of the exhaust hole 514. The exhaust plate 532 may substantially have a ring shape when viewed from the top. Furthermore, at least one exhaust hole may be formed in the exhaust plate 532. The operator may select, among a plurality of exhaust plates 532 having various shapes and sizes, an exhaust plate 532 that may uniformly exhaust the treatment space and install the exhaust plate 532 at an upper portion of the exhaust hole 514.

Furthermore, the process chamber 510 may further include a support member 516. The support member 516 may support at least a portion of a base included in the support unit 550, which will be described below. For example, the support member 516 may be configured to support a lower portion of an insulation plate 554 included in the support unit 550.

The power source unit 540 may generate RF power that excites the process gas supplied by the gas supply unit 590, which will be described below, in a plasma state. The power source unit 540 may include a power source 542 and a matcher 544. The power supply 542 and the matcher 544 may be installed on an electric power transmission line. Furthermore, the electric power transmission line may be connected to a chuck 552.

The support unit 550 may support the substrate "W" in the treatment space 510 of the process chamber 510. The support unit 550 may include the chuck 552, an insulation plate 554, a quartz ring 556, and a sealing member 558.

The chuck 552 may have a support surface that supports the substrate "W". The chuck 552 may support the substrate W", and may chuck the supported substrate "W". For example, an electrostatic plate (not illustrated) may be provided in the chuck 552, and the chuck 552 may be an electrostatic chuck that chucks the substrate "W" by using an electrostatic force. For example, the chuck 552 may be an electrode static chuck (ESC). However, the inventive concept is not limited thereto, and the chuck 552 may chuck the substrate "W" in a vacuum suction scheme.

The insulation plate 554 may have a circular shape when viewed from a top. The above-described chuck 552, and the quartz ring 556, which will be described below, may be positioned on the insulation plate 554. The insulation plate 554 may be a dielectric body. For example, the insulation plate 554 may be formed of a material including ceramics.

The quartz ring 556 may be formed of a material including quartz. The quartz ring 556 may substantially have a ring shape when viewed from the top. The quartz ring 556 may substantially have a shape that surrounds the chuck 552 when viewed from the top. The quartz ring 556 may have a shape that surrounds the substrate W"" supported by the chuck 552 when viewed from the top.

Furthermore, the quartz ring 556 may have a stepped shape such that a height of an upper surface of an inner side thereof and a height of an upper surface of an outer side thereof may be different. For example, the height of the upper surface of the inner side of the quartz ring 556 may be lower than the height of the upper surface of the outer side thereof. Furthermore, the ring member FR (for example, a focusing ring) may be positioned on the upper surface of the inner side of the quartz ring 556.

The sealing member 558 may be provided between the insulation plate 554 and the chuck 553 to prevent an arc from being generated in a gap between pin holes formed the insulation plate 554 and the chuck 552, which will be described below.

The ring lift module 560 may elevate the ring member FR positioned on the upper surface of the inner side of the quartz ring 556. The ring lift module 560 may include a ring lift pin 562 and a ring lift pin elevating part 564. The ring lift pin 562 may be moved upwards and downwards along the pin holes formed in the insulation plate 554 and/or the quartz ring 556. Furthermore, the ring lift pin 562 may be moved upwards and downwards by the ring lift pin elevating part 564 that elevates the ring lift pin 562. The ring lift pin elevating pin 564 may be a cylinder that uses a pneumatic pressure or a hydraulic pressure, or a motor.

The substrate lift module 570 may elevate the substrate "W" positioned on the chuck 552, The substrate lift module 570 may include a substrate lift pin 572, a substrate lift pin elevating part 574, an elevation pin 576, and a bellows 578. The substrate lift pin 572 may be moved upwards and downwards along the pin holes formed in the insulation plate 554 and/or the chuck 552. The substrate lift pin 572 may be coupled to the elevation pin 576 that has received power from the substrate lift pin elevating part 574, and may be moved upwards and downwards through elevation of the elevation pin 576. Furthermore, the bellows 578 that may maintain an airtightness may be installed at a connection portion of the elevation plate 576 and the substrate lift pin 572.

The baffle plate 580 may be provided at an upper portion of the support unit 550. The baffle plate 580 may be formed of an electrode material. At least one baffle hole 582 may be formed in the baffle plate 580. For example, a plurality of baffle holes 582 may be formed, and may be uniformly formed in a whole area of the baffle plate 580 when viewed from the top. The baffle plate 580 makes it possible to uniformly deliver the process gas supplied by the gas supply unit 590, which will be described below, to the substrate "W".

The gas supply unit 590 may supply the process gas into the treatment space of the process chamber 510. The process gas may be a gas that is excited into a plasma state by the power source unit 540, which will be described below. The gas supply unit 590 may include a gas supply source 592 and a gas supply line 594. One end of the gas supply line 594 may be connected to the gas supply source 592, and an opposite end of the gas supply line 594 may be connected to an upper portion of the process chamber 510. Accordingly, the process gas delivered by the gas supply source 592 may be supplied to an upper area of the baffle plate 580 through the gas supply line 594. The process gas supplied to the upper area of the baffle plate 580 may be introduced into the treatment space of the process chamber 510 through the baffle hole 582.

Figure 9:
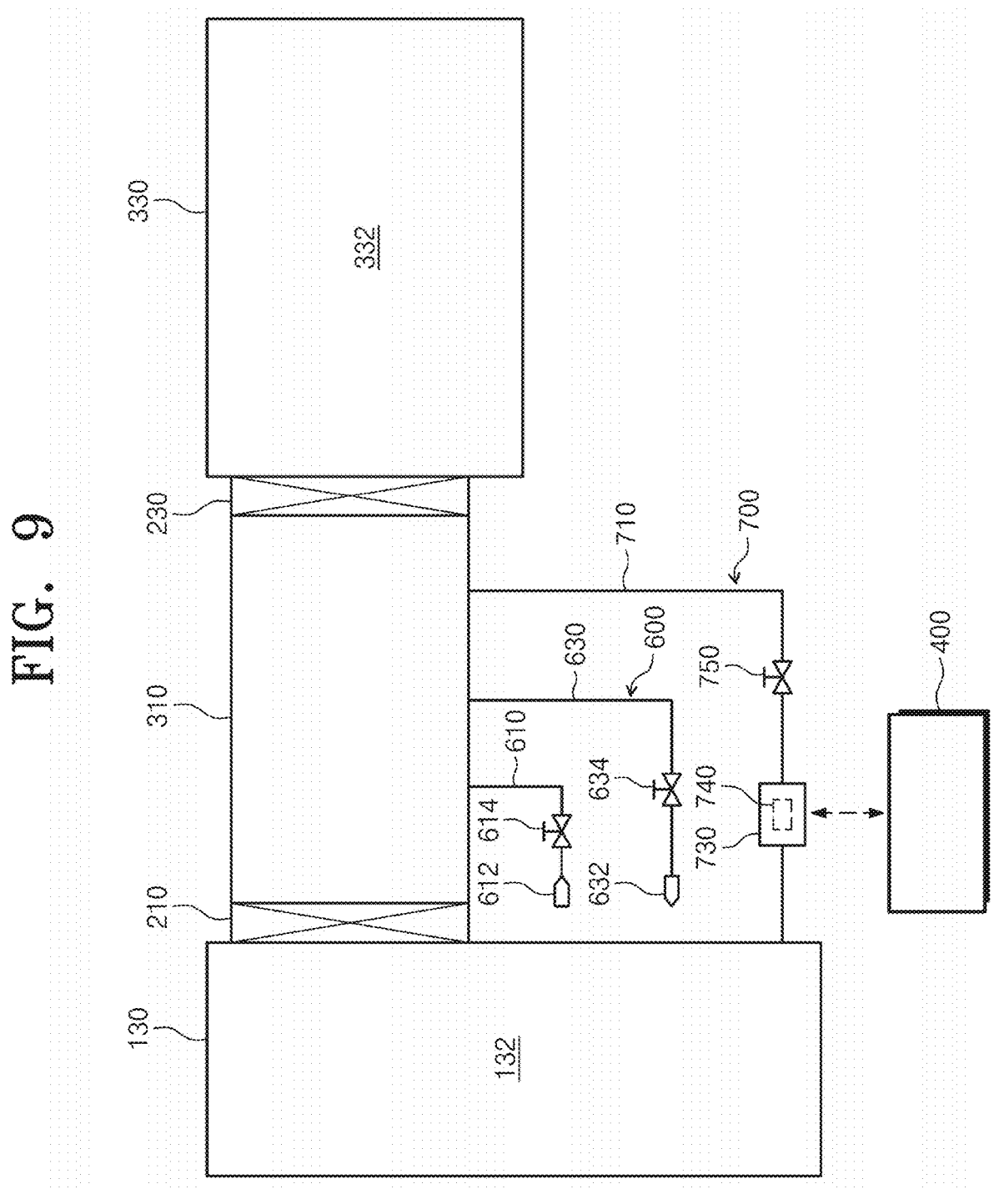
FIG. 9 is a view schematically illustrating an index chamber, a load lock chamber, a transfer chamber, a pressure adjusting unit, and a measurement unit of FIG. 1.

FIG. 9 is a view schematically illustrating an index chamber, a load lock chamber, a transfer chamber, a pressure adjusting unit, and a measurement unit of FIG. 1. Referring to FIG. 9, the substrate treating apparatus 1000 according to the embodiment of the inventive concept may include the load lock chamber 310 (an example of the first chamber), the index chamber 130 (an example of the second chamber), and the transfer chamber 330 (an example of the third chamber), which have been described above. Furthermore, the load lock chamber 310 may have a first interior space 312, the index chamber 130 may have a second interior space 132, and the transfer chamber 330 may have a third interior space 332. The first transfer robot 150 may be provided in the second interior space 132. Furthermore, a pressure of the second interior space 132 may be maintained at a third pressure. For example, the third pressure may be an atmospheric pressure. The second transfer robot 350 may be provided in the third interior space 332.

The first gate valve 210 that selectively communicates the first interior space 312 and the second interior space 132 may be provided between the load lock chamber 310 and the index chamber 130. The second gate valve 230 that selectively communicates the first interior space 312 and the third interior space 332 may be provided between the load lock chamber 310 and the transfer chamber 330.

The substrate treating apparatus according to the embodiment of the inventive concept may include a pressure adjusting unit 600. The pressure adjusting unit 600 may adjust a pressure of the first interior space 312 of the load lock chamber 310. The pressure adjusting unit 600 may include a gas supply line 610 and a pressure reducing line 630.

One end of the gas supply line 610 may be connected to the vent hole 313. A gas supply valve 614 may be installed in the gas supply line 610. Furthermore, the gas supply line 610 may receive an inert gas from a gas supply source 612 and supply the gas to the first interior space 312. When the gas supply line 610 supplies the gas into the first interior space 312, a pressure of the first interior space 312 may be increased.

Furthermore, one end of the pressure reducing line 630 may be connected to the above-described pressure reducing hole 314. A pressure reducing valve 634 may be installed in the pressure reducing line 630. Furthermore, the pressure reducing line 630 may receive the reduced pressure from a pressure reducing member 632 such as a pump or the like and may exhaust gas currents in the first interior space 312. When the pressure reducing line 630 exhausts the gas currents in the first interior space 312, the pressure of the first interior space 312 may be decreased.

The above-described controller 400 may control the pressure adjusting unit 600 to change the pressure of the first interior space 312 between a first pressure (for example, the atmospheric pressure), and a second pressure (for example, the vacuum pressure) that is lower than the first pressure. Accordingly, the atmosphere in the first interior space 312 may be switched between the atmospheric pressure atmosphere and the vacuum pressure atmosphere.

A measurement unit 700 may measure a level of particles in the first interior space 312 of the load lock chamber 310. The measurement unit 700 may be located and installed outside the load lock chamber 310. The measurement unit 700 may deliver a measured value for the level of the particles to the controller 400. The measurement unit 700 may include a measurement passage 710, a measurement container 730, a measurement sensor 740, and a valve 750.

The measurement passage 710 may be a passage, through which a fluid may flow. For example, the measurement passage 710 may be a passage, through which the gas currents in the first interior space 312 may flow. The measurement passage 710 may be provided between the load lock chamber 310 and the index chamber 130. One end of the measurement passage 710 may be connected to the load lock chamber 310, and an opposite end of the measurement passage 710 may be connected to the index chamber 130. Accordingly, the gas currents in the first interior space 312 may be introduced from the first interior space 312 into the second interior space 132 through the measurement passage 710.

Figure 10:
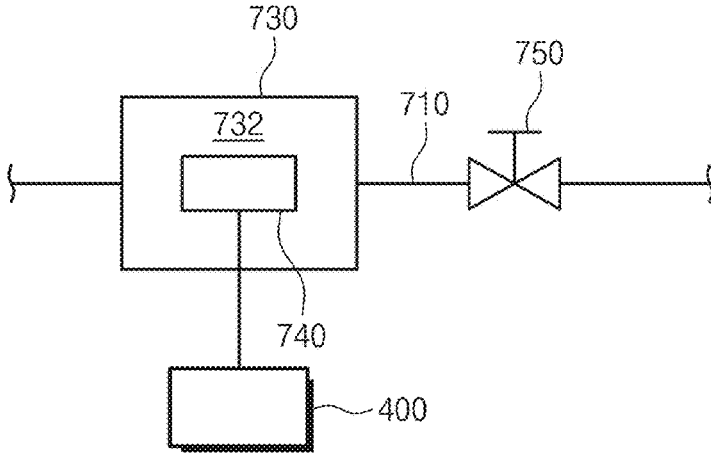
FIG. 10 is a view schematically illustrating the measurement unit of FIG. 9.

Furthermore, the measurement container 730, as illustrated in FIG. 10, may be installed on the measurement passage 710. The measurement container 730 may have a sensing space 732, in which the measurement sensor 740 is provided. The measurement sensor 740 may measure the level of the particles included in the gas currents in the first interior space 312, in the sensing space 732. For example, the measurement sensor 740 may measure the level of the particles included in the gas currents in the first interior space 312, which is introduced into the sensing space 732.

Referring to FIG. 9 again, the valve 750 may be installed on the measurement passage 710. The valve 750 may be an on/off valve. The valve 750 may be selectively opened and closed. For example, the valve 750 may receive a control signal from the controller 400 and may be selectively switched on and off. Unlike this, the valve 750 may be selectively switched on and off through a manual manipulation by an operator. The valve 750 may be selectively switched on and off such that a fluid may selectively flow through the measurement passage 710.

Hereinafter, a method for measuring particles according to the embodiment of the inventive concept will be described in detail. The method for measuring particles, which will be described below, may be a method for measuring a level of particles that reside in the first interior space 312 of the load lock chamber 310. Furthermore, to perform the method for measuring particles, which will be described below, the controller 400 may control the substrate treating apparatus 1000. For example, the controller 400 may control the pressure adjusting unit 600 and the measurement unit 700.

Figure 11:
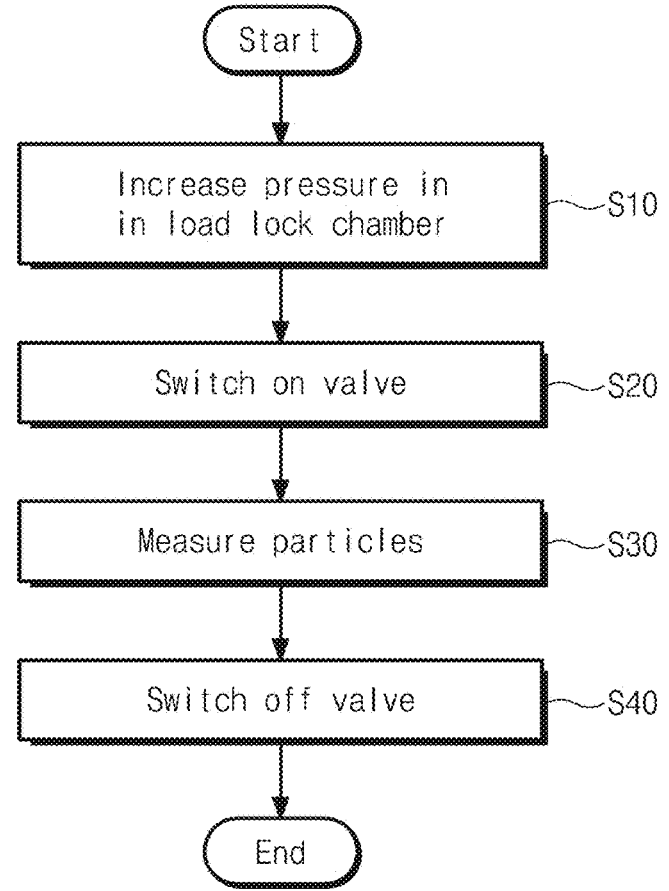
FIG. 11 is a flowchart illustrating a particle measuring method according to an embodiment of the inventive concept.

FIG. 11 is a flowchart illustrating a particle measuring method according to an embodiment of the inventive concept.

Figure 12:
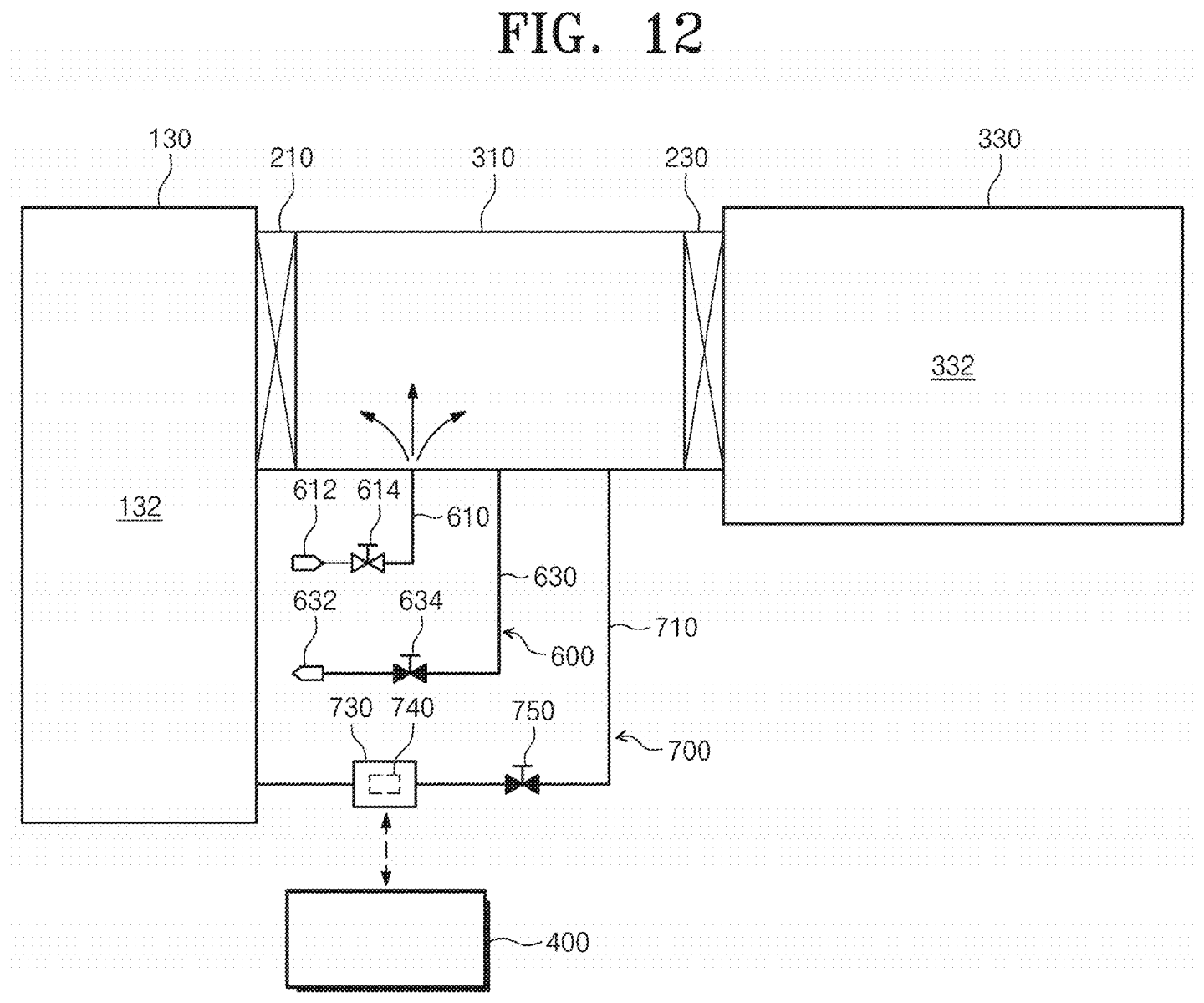

When a level of particles that reside in the interior space 312 of the load lock chamber 310 is to be measured, in a first operation (S10), the gas supply line 610 of the pressure adjusting unit 600 supplies gas into the first interior space 312 (see FIG. 12). Then, the gas supply valve 614 may be switched on, the pressure reducing valve 634 may be switched off, and the valve 750 may be switched off. As the gas is supplied into the first interior space 312, the pressure in the first interior space 312 is increased. For example, in the first operation (S10), the pressure in the first interior space 312 may be increased to a preset pressure. The preset pressure may be a pressure that is higher than the pressure of the second interior space 132.

Figure 13:
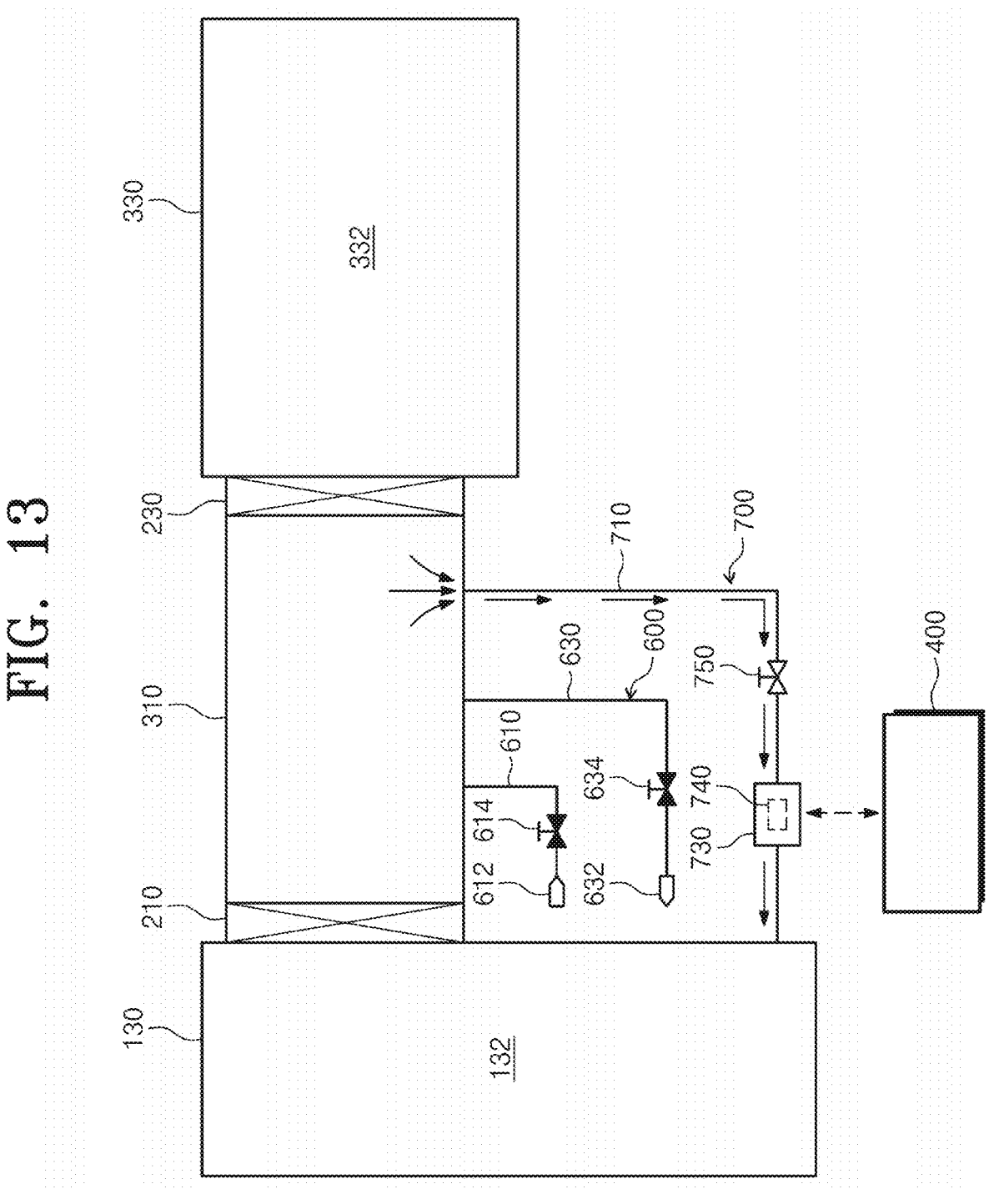
FIG. 13 is a view illustrating a state of the substrate treating apparatus, in which a fluid flows in a measurement passage by switching on a valve.
Figure 14:
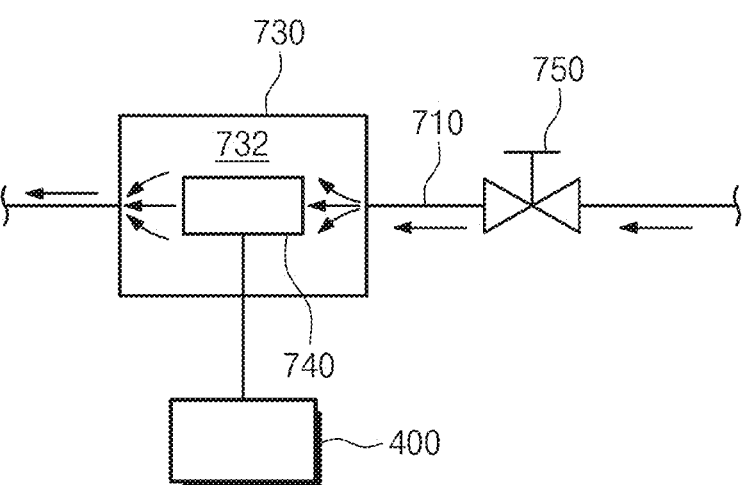
FIG. 14 is a view illustrating a state of the substrate treating apparatus that increases a level of particles in the load lock chamber.

In the second operation (S20), the valve 750 may be switched on (see FIG. 13). The second operation (S20) may be performed after the pressure of the first interior space 312 reaches a preset pressure. When the valve 750 is switched on after the pressure of the first interior space 312 reaches the preset pressure, the fluid may flow through the measurement passage 710 due to a difference of pressures of the first interior space 312 and the second interior space 132. Then, the fluid that flows through the measurement passage 710 may be gas currents in the first interior space 312. Furthermore, the gas currents in the first interior space 312, which flow in the measurement passage 710, may be introduced into the second interior space 132. Furthermore, in the second operation (S20), the gas supply valve 614 may be switched off, the pressure reducing valve 634 may be switched off, and the valve 750 may be switched on.

In a third operation (S30), the measurement sensor 740 may measure the level of the particles included in the gas currents in the first interior space 312. For example, the gas currents that flow in the measurement passage 710 may be introduced into the sensing space 732 of the measurement container 730. The measurement sensor 740 may measure the level of the particles included in the gas currents in the first interior space 312, which are introduced into the sensing space 732, and may deliver the measured data to the controller 400 (see FIG. 14).

Figure 15:
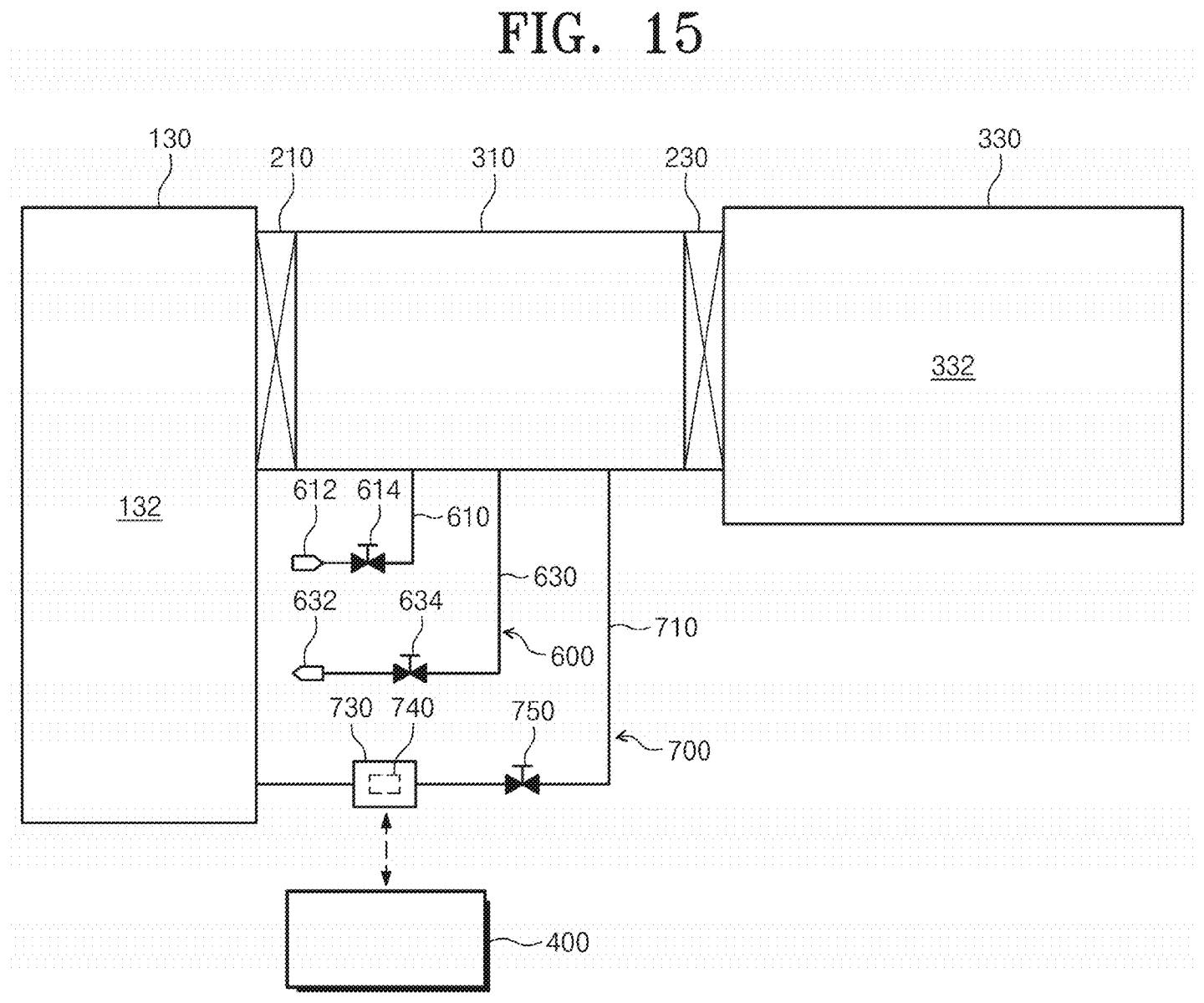

When the measurement sensor 740 completely measures the particles, in a fourth operation (S40), the valve 750 may be switched off such that the gas currents in the first interior space 312 do not flow in the measurement passage 710 (see FIG. 15).

The treated substrate "W" as well as the substrate "W" that has not been treated are repeatedly carried into the load lock chamber 310. Accordingly, there is a high possibility of a danger of, fumes that may be attached to the treated substrate "W", contaminating the first interior space 312 of the load lock chamber 310. Accordingly, it is necessary to periodically measure the level of the particles for the first interior space 312.

Accordingly, a measure of disposing a sensor that may measure the level of the particles in the load lock chamber 310, but the sensor may occupy a large space in the first interior space 312. Accordingly, the measurement unit 700 of the substrate treating apparatus 1000 according to the embodiment of the inventive concept is located and installed on an outside of the load lock chamber 310. Accordingly, because the sensor is installed in the load lock chamber 310, and a large space in the first interior space 312 is occupied, but a problem, in which a small aperture may be formed in the interior space 312 so that impurities, such as particles and the like, may be introduced into the aperture, may be solved. Furthermore, according to the embodiment of the inventive concept, the gas currents in the first interior space 312 may flow along the measurement passage 710 and may be introduced into the sensing space 732 of the measurement container 730. The sensing space 732 may have a volume that is smaller than that of the first interior space 312. Accordingly, the gas currents in the first interior space 312, which is introduced into the sensing space 732, may be relatively concentrated, and thus, the precision of the level of the particles, which is measured by the measurement sensor 740, may be further increased.

Figure 16:
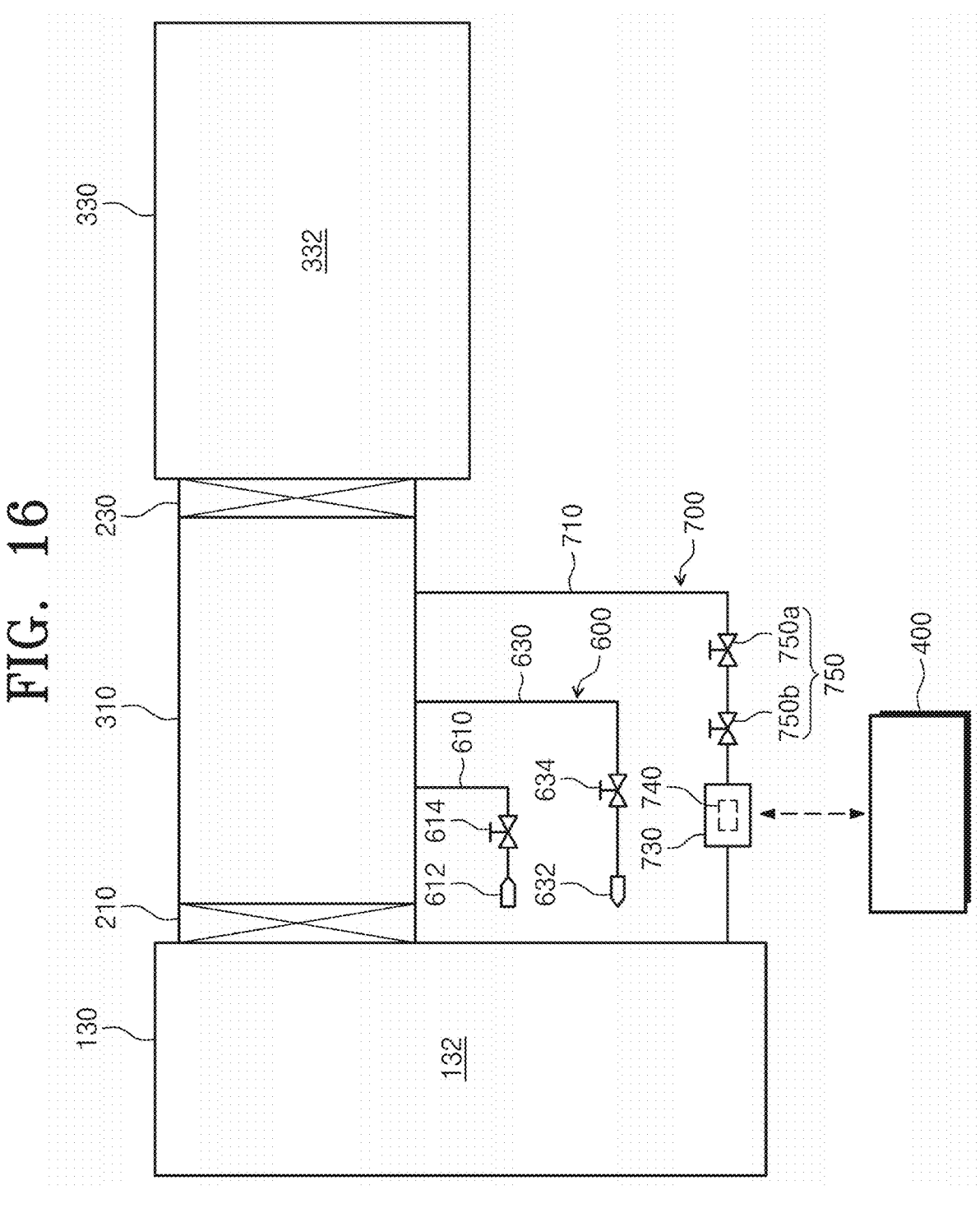
FIG. 16 is a view illustrating a substrate treating apparatus according to another embodiment of the inventive concept.

FIG. 16 is a view illustrating a substrate treating apparatus according to another embodiment of the inventive concept. Referring to FIG. 16, the valve 750 may include a first valve 750a and a second valve 750b. The first valve 750a and the second valve 750b may be connected in series to each other on the measurement passage 710. The valve 750a may receive a control signal from the controller 400 and may be switched on and off. The first valve 750a may be an equalizer valve.

It is preferable that the pressure of the first interior space 312 and the pressure of the second interior space 132 may be the same when the first gate valve 210 communicates the first interior space 312 and the second interior space 132. For example, the gas supply line 610 may raise the pressure of the first interior space 312 from the second pressure (for example, the vacuum pressure) to the first pressure (for example, the atmospheric pressure) by supplying the gas into the first interior space 312 before the first gate valve 210 communicates the first interior space 312 and the second interior space 132. Furthermore, a pressure of the second interior space 132 may be maintained at a third pressure. The third pressure may be the atmospheric pressure that is the same as the first pressure. Then, a fine different may be present between the third pressure and the third pressure, and the first interior space 312 and the second interior space 1321 may be communicated with each other in advance as the first valve 750a is switched on. Accordingly, the flows of the gas current that may be generated when the first gate valve 210 communicates the first interior space 312 and the second interior space 132 may be minimized.

Furthermore, the second valve 750b may be a manual valve that is switched on and off through a manual manipulation by the operator. When the operator does not desire to measure particles or to prevent the gas currents in the first interior space 312 from being introduced into the second interior space 132 when the index chamber 130 is to be maintained, the second valve 750b may be selectively switched on and off through a manual manipulation by the operator if necessary.

Figure 17:
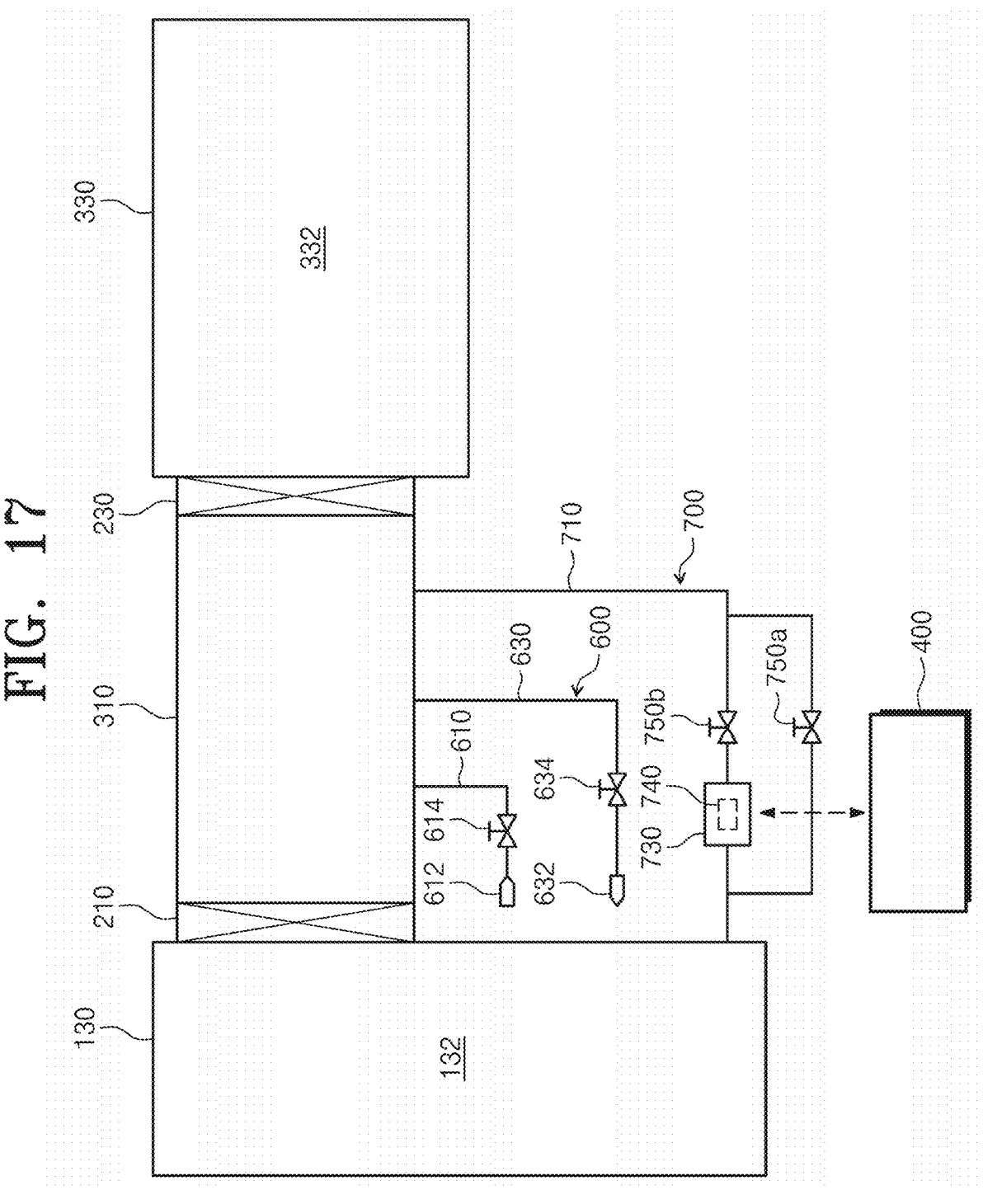
FIG. 17 is a view illustrating a substrate treating apparatus according to another embodiment of the inventive concept.

Although it has been described in the above example that the first valve 750a and the second valve 750b are connected in series to each other, the inventive concept is not limited thereto. For example, as illustrated in FIG. 17, the first valve 750a and the second valve 750b may be connected in parallel to each other. In this case, the above-described functions implemented through switching on/off of the first valve 750a and the second valve 750b may be separated.

Figure 18:
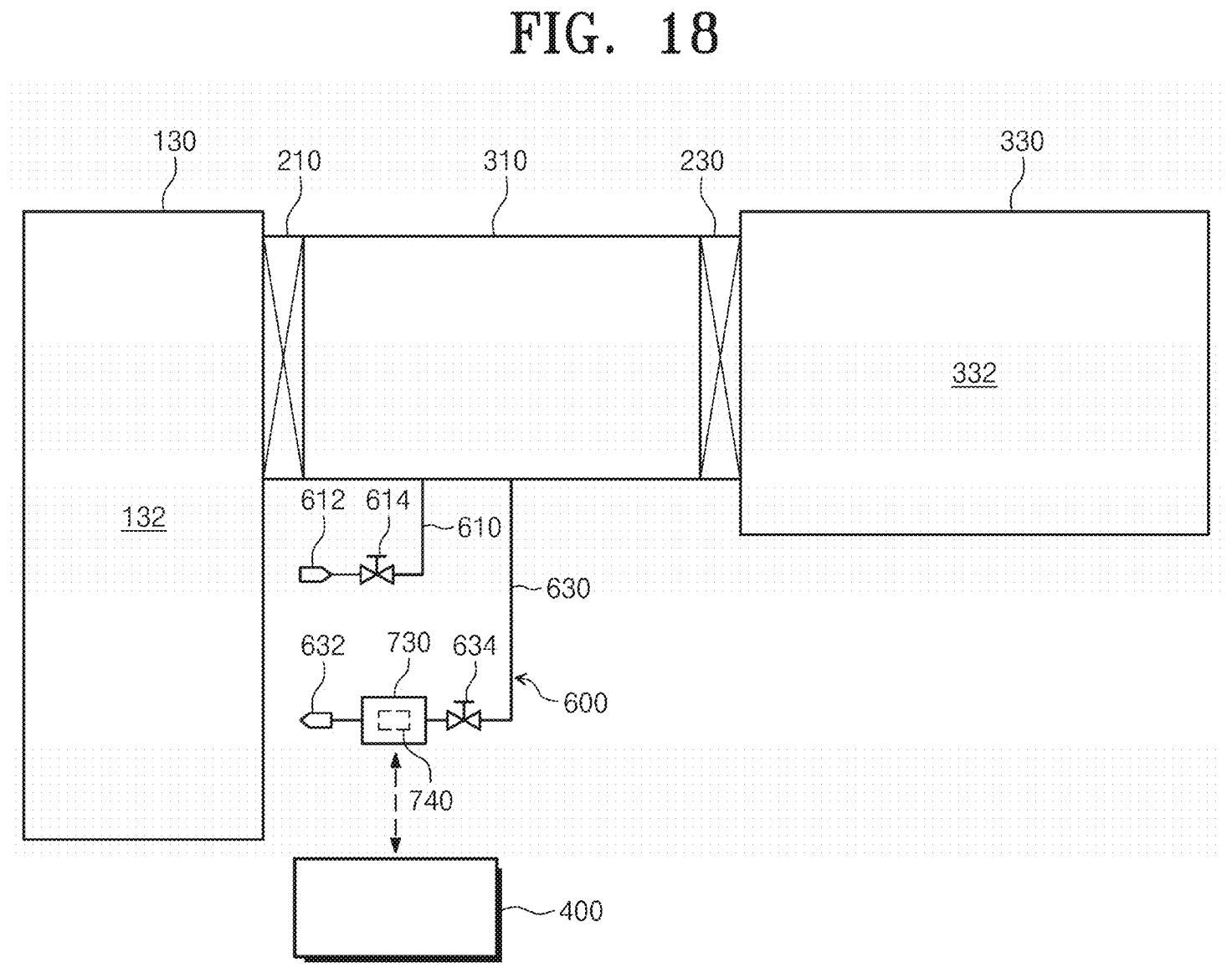

Although it has been described in the above example that the measurement container 730 and the measurement sensor 740 are provided on the measurement passage 710, the inventive concept is not limited thereto. For example, as illustrated in FIG. 18, the measurement container 730 and the measurement sensor 740 may be provided on the pressure reducing line 630.

Figure 19:
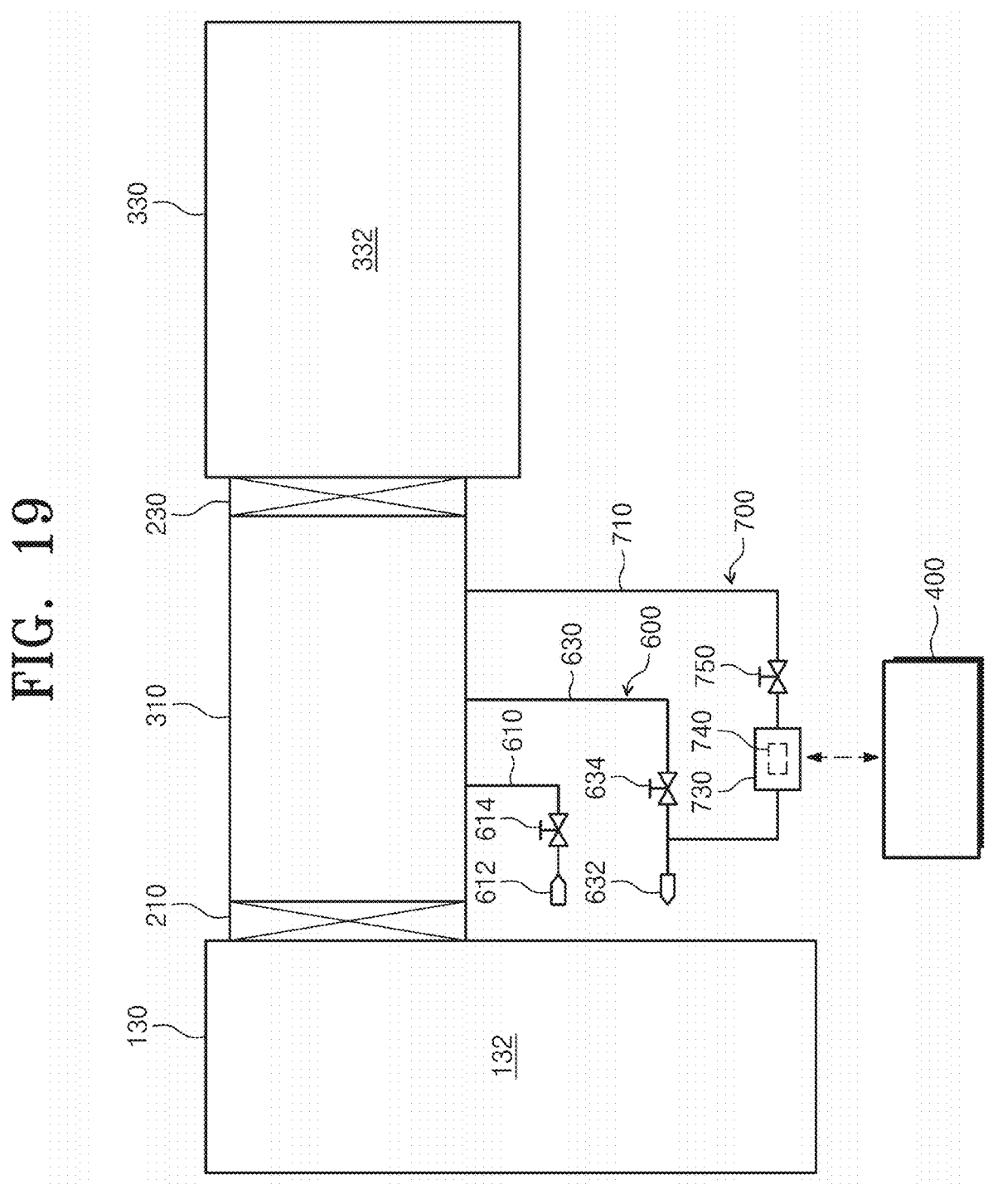
FIG. 19 is a view illustrating a substrate treating apparatus according to another embodiment of the inventive concept.
Figure 20:
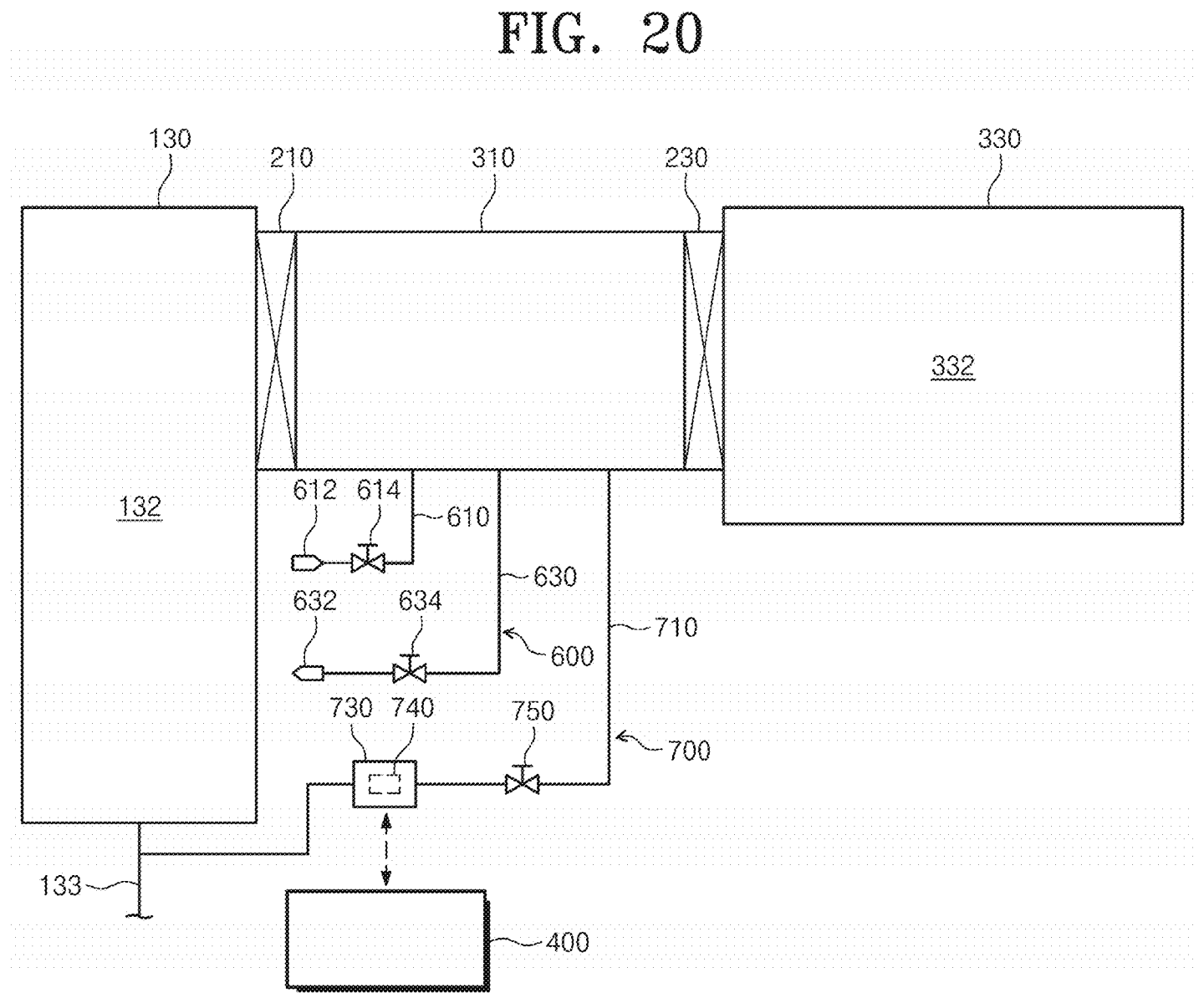

Although it has been described in the above example that an opposite end of the measurement passage 710 is connected to the index chamber 130, the inventive concept is not limited thereto For example, as illustrated in FIG. 19, an opposite end of the measurement passage 710 may be connected to the pressure reducing line 630. Unlike, as illustrated in FIG. 20, the opposite end of the measurement passage 710 may be connected to an index exhaust line 133 that exhausts the second interior space 132 of the index chamber 130. In other embodiments of the inventive concept, the particles in the load lock chamber 310 may be prevented from being introduced into the second interior space 132 of the index chamber 130.

According to an embodiment of the inventive concept, a level of particles in a chamber, of which a pressure of an interior space is changed.

Furthermore, according to the embodiment of the inventive concept, a level of particles in a load lock chamber may be periodically measured.

Furthermore, according to the embodiment of the inventive concept, a measurement precision of a level of particles that reside in a chamber may be further increased.

The effects of the inventive concept are not limited to the above-mentioned effects, and the unmentioned effects can be clearly understood by those skilled in the art to which the inventive concept pertains from the specification and the accompanying drawings.

Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
a load lock chamber, of which a pressure of an interior space is changed between a first pressure and a second pressure that is lower than the first pressure;
an index chamber connected to the load lock chamber;
a plurality of passages connecting the index chamber and the load lock chamber, the plurality of passages including a primary passage and a measurement passage, the primary passage gated by a gate valve and the measurement passage being an auxiliary passage that is activated during a measurement operation by opening at least one valve;
a measurement unit including the at least one valve installed on the measurement passage, a measurement container installed on the measurement passage downstream of the at least one valve, and a measurement sensor within a sensing space within the measurement container such that the at least one valve and the measurement sensor are located outside the load lock chamber; and
a controller configured to control the substrate treating apparatus to perform the measurement operation to measure a level of particles in the sensing space by transmitting one or more control signals to,
increase the pressure in the interior space of the load lock chamber to the first pressure,
transfer the particles from the interior space to the index chamber via the measurement passage by turning on the at least one valve to connect the interior space of the load lock chamber at the first pressure to the index chamber via the measurement passage,
measure, via the measurement sensor, the level of the particles in the sensing space as the particles traverse the sensing space while flowing from the interior space to the index chamber via the measurement passage with the measurement sensor inline therein such that the particles are measured within the sensing space that is smaller than the load lock chamber and the index chamber and are transferred to the index chamber after measuring the level thereof, and turn off the at least one valve after measuring the level of particles in the sensing space to disconnect the sensing space from the interior space of the load lock chamber.

2. The substrate treating apparatus of claim 1, wherein a gas supply line configured to supply a gas into the interior space and a pressure reducing line configured to reduce a pressure of the interior space are connected to the load lock chamber.

3. A substrate treating apparatus comprising:
a first chamber having a first interior space having a pressure that is changed between a first pressure and a second pressure that is lower than the first pressure;
a second chamber connected to the first chamber, the second chamber having a second interior space having a pressure maintained at a third pressure;
a plurality of passages connecting an index chamber and a load lock chamber, the plurality of passages including a primary passage and a measurement passage, the primary passage gated by a gate valve and the measurement passage being an auxiliary passage that is activated during a measurement operation by opening a first valve;
a measurement unit including the first valve installed on the measurement passage, a measurement container installed on the measurement passage downstream of the first valve, and a measurement sensor within a sensing space within the measurement container such that the first valve and the measurement sensor are located outside the first chamber and the second chamber; and
a controller configured to control the substrate treating apparatus to perform the measurement operation to measure a level of particles in the sensing space by transmitting one or more control signals to,
increase the pressure in the first interior space of the first chamber to the first pressure,
transfer the particles from the interior space to the index chamber via the measurement passage by turning on the first valve to connect the first interior space of the first chamber at the first pressure to the second interior space of the second chamber via the measurement passage,
measure, via the measurement sensor, the level of the particles in the sensing space as the particles traverse the sensing space while flowing from the first interior space to the second interior space via the measurement passage with the measurement sensor inline therein such that the particles are measured within the sensing space that is smaller than the load lock chamber and the index chamber and are transferred to the index chamber after measuring the level thereof, and
turn off the first valve after measuring the level of particles in the sensing space to disconnect the sensing space from the first interior space of the first chamber.

4. The substrate treating apparatus of claim 3, wherein a gas supply line configured to supply an inert gas into the first interior space and a pressure reducing line configured to reduce a pressure of the first interior space are connected to the first chamber.

5. The substrate treating apparatus of claim 4, wherein the controller is configured to control any one of the gas supply line, the pressure reducing line, and the measurement unit such that gas currents in the first interior space flows in the measurement passage by a difference between the pressure of the first interior space and the pressure of the second interior space when the level of the particles in the first interior space is to be measured.

6. The substrate treating apparatus of claim 4, wherein the measurement unit further includes:

the first valve installed in the measurement passage, and wherein the controller is configured to control the measurement unit.

7. The substrate treating apparatus of claim 6, wherein the controller is configured to control at least any one of the gas supply line, the pressure reducing line, and the measurement unit to switch on the first valve after a pressure difference is generated between the first interior space and the second interior space.

8. The substrate treating apparatus of claim 6, wherein the measurement unit further includes:

a second valve, wherein the first valve is configured to receive a control signal from the controller and configured to be switched on and off, and wherein the second valve is configured to be switched on and off through a manual manipulation.

9. The substrate treating apparatus of claim 8, wherein a gate valve configured to selectively communicate the first interior space and the second interior space is provided between the first chamber and the second chamber, and wherein the controller is configured to control at least any one of the gas supply line, the pressure reducing line, and the measurement unit to switch on the first valve after a pressure of the first interior space is raised from the second pressure to the first pressure.

10. The substrate treating apparatus of claim 3, wherein the first pressure is the same as the third pressure.

11. A substrate treating apparatus comprising:

an index chamber, in which a load pot in which a container is seated, is installed, and of which an internal atmosphere is maintained at an atmospheric pressure;

a process chamber configured to treat a substrate;

a transfer chamber configured to transfer the substrate to the process chamber, and of which an internal atmosphere is maintained at a vacuum pressure atmosphere;

a load lock chamber provided between the transfer chamber and the index chamber, and of which an internal atmosphere is changed between the atmospheric pressure and the vacuum pressure atmosphere;

a plurality of passages connecting the index chamber and the load lock chamber, the plurality of passages including a primary passage and a measurement passage, the primary passage gated by a gate valve and the measurement passage being an auxiliary passage that is activated during a measurement operation by opening at least one valve;

a measurement unit including the at least one valve installed on the measurement passage, a measurement container installed on the measurement passage downstream of the at least one valve, and a measurement sensor within a sensing space within the measurement container such that the at least one valve and the measurement sensor are located outside the load lock chamber and the index chamber; and a controller configured to control the substrate treating apparatus to perform the measurement operation to measure a level of particles in the sensing space by transmitting one or more control signals to, increase the internal atmosphere of the load lock chamber to the atmospheric pressure, transfer the particles from the interior space to the index chamber via the measurement passage by turning on the at least one valve to connect the load lock chamber at the atmospheric pressure to the index chamber via the measurement passage, measure, via the measurement sensor, the level of the particles in the sensing space as the particles traverse the sensing space while flowing from the load lock chamber to the index chamber via the measurement passage with the measurement sensor inline therein such that the particles are measured within the sensing space that is smaller than the load lock chamber and the index chamber and are transferred to the index chamber after measuring the level thereof, and turn off the at least one valve after measuring the level of particles in the sensing space to disconnect the sensing space from the load lock chamber.

12. The substrate treating apparatus of claim 11, wherein a gas supply line configured to supply a gas into the load lock chamber and a pressure reducing line configured to reduce a pressure of the load lock chamber are connected to the load lock chamber.

13. The substrate treating apparatus of claim 12, wherein the controller is configured to, control the gas supply line such that a pressure in the load lock chamber becomes a pressure in the index chamber by supplying the gas into a space in the load lock chamber when the level of the particles in the load lock chamber is to be measured, and switch on the valve after the pressure in the load lock chamber becomes higher than the pressure in the index chamber.

* * * * *